(12) United States Patent
Izumi et al.

(10) Patent No.: US 6,342,700 B1
(45) Date of Patent: Jan. 29, 2002

(54) TWO-DIMENSIONAL IMAGE DETECTOR

(75) Inventors: Yoshihiro Izumi, Kashihara; Osamu Teranuma, Tenri; Toshiyuki Sato, Kyoto; Satoshi Tokuda, Kusatsu, all of (JP)

(73) Assignees: Sharp Kabushiki Kaisha, Osaka; Shimadzu Corporation, Kyoto, both of (JP)

( * ) Notice: Subject to any disclaimer, the term of this patent is extended or adjusted under 35 U.S.C. 154(b) by 0 days.

(21) Appl. No.: 09/298,169

(22) Filed: Apr. 23, 1999

(30) Foreign Application Priority Data

Apr. 27, 1998 (JP) .......................................... 10-116333
Mar. 3, 1999 (JP) .......................................... 11-056144

(51) Int. Cl.[7] ................................................ G01T 1/24
(52) U.S. Cl. .............................. 250/370.13; 250/370.12
(58) Field of Search ...................... 250/370.13, 370.14, 250/370.12, 580, 208.1; 257/448, 72

(56) References Cited

U.S. PATENT DOCUMENTS 5,563,421 A * 10/1996 Lee et al. .................. 250/580
5,635,718 A * 6/1997 DePuydt ................ 250/370.09
5,895,936 A * 4/1999 Lee .............................. 257/59

FOREIGN PATENT DOCUMENTS

JP 6-342098 A 12/1994

OTHER PUBLICATIONS

Jeromin et al, "Application of a–Si Active–Matrix Technology in a X–Ray Detector Panel", SID '97 Digest, p. 91–94, 1997.

Lee et al, "A New Digital Dector for Projection Radiography", SPIE, vol. 2432, p. 237–249, 1995.

* cited by examiner

Primary Examiner—Georgia Epps
Assistant Examiner—Richard Hanig
(74) Attorney, Agent, or Firm—Nixon & Vanderhye P.C.

(57) ABSTRACT

An active matrix substrate provided with a matrix of electrode wires, a plurality of thin film transistors (TFTs) individually formed at intersections of the matrix, and pixel electrodes connected to the electrode wires through the thin film transistors (TFTs) is laminated to a counter substrate provided with connecting electrodes by means of an anisotropic conductive bonding agent. The counter substrate is composed of 12 divided pieces which are tiled as panes.

20 Claims, 13 Drawing Sheets

TWO-DIMENSIONAL IMAGE DETECTOR

FIELD OF THE INVENTION

The present invention relates to a 2-D image detector capable of detecting an image by using radial rays, such as X-rays, visible light, infrared light, etc.

BACKGROUND OF THE INVENTION

A conventionally known 2-D image detector for detecting an image by using radial rays is provided with two-dimensionally aligned semiconductor sensors which generate charges (electrons-holes) upon detection of X-rays and electric switches which are individually attached to the sensors, so that the charges are read out from the sensors per column by sequentially turning on the electric switches per row. Detailed arrangements and operation principle of such a radiographic 2-D image detector are described in, for example, "A New Digital Detector for Projection Radiography" SPIE, 2432, pp. 237–249, 1995, D. L. Lee, et al., "Application of a-Si Active-Matrix Technology in an X-Ray Detector Panel", SID 97 DIGEST, pp 91–94, 1997, L. S. Jeromin, et al., Japanese Laid-open Patent Application No. 342098/1994 (Japanese Official Gazette, Tokukaihei No. 6-342098, published on Dec. 13, 1994), etc.

The following will explain an arrangement and an operation principle of the conventional radiographic 2-D image detector.

FIG. 12 is a view which schematically explains an arrangement of the conventional radiographic 2-D image detector, and FIG. 13 is a cross section which schematically shows an arrangement of each pixel of FIG. 12.

As shown in FIGS. 12 and 13, the conventional radiographic 2-D image detector comprises an active matrix substrate having a glass substrate 51 on which are formed an X by Y matrix (hereinafter, referred to X-Y matrix) of electrode wires (gate electrodes 52 and source electrodes 53), thin film transistors (TFTs) 54, charge accumulating capacitors (Cs') 55, etc. In addition, a photoconductive film 56, a dielectric layer 57, and a top electrode 58 are formed almost entirely on the active matrix substrate.

Each of the charge accumulating capacitors 55 comprises a charge accumulating capacitor electrode (Cs electrode) 59, and a pixel electrode 60 which is connected to the drain electrode of the TFT 54. The two electrodes 59 and 60 are placed to oppose each other through an insulating layer 61.

The photoconductive film 56 is made of a semiconductor material which generates charges (electrons-holes) upon irradiation of radial rays, such as X-rays. The semiconductor material used in the aforementioned publications is amorphous selenium (a-Se) which has good resistance to darkness and shows excellent photoconductivity upon X-ray irradiation. The photoconductive film (a-Se) 56 is formed in a thickness ranging from 300 to 600 μm by means of vacuum deposition.

The active matrix substrate can be the one manufactured in the liquid crystal display manufacturing process. To be more specific, an active matrix substrate used for an active matrix liquid crystal display (AMLCD) is provided with thin film transistors (TFTs) made of amorphous silicon (a-Si) or poly silicon (p-Si), and an X-Y matrix of electrodes and charge accumulating capacitors (Cs'). Thus, the active matrix substrate manufactured in the liquid crystal display manufacturing process can be used as an active matrix substrate for the radiographic 2-D image detector by slightly changing the specification.

Next, the following will explain the operation principle of the above-arranged radiographic 2-D image detector.

When radial rays are irradiated on the photoconductive film 56, such as the aforementioned a-Se film, the charges (electrons-holes) are generated therein. As shown in FIGS. 12 and 13, the photoconductive film 56 is electrically connected to the charge accumulating capacitors 55 in series. Thus, if a voltage is applied across the top electrode 58 and charge accumulating capacitor electrodes 59, the charges (electrons-holes) generated in the photoconductive film 56 start to migrate to the positive electrode end and negative electrode end, whereby the charges are accumulated in the charge accumulating capacitors 55.

Here, a charge blocking layer 62 made of a thin insulating layer is formed between the photoconductive film 56 and charge accumulating capacitors 55. The charge blocking layer 62 functions as a blocking photodiode which inhibits charge injection from one of the surfaces thereof.

The charges accumulated in the charge accumulating capacitors 55 in the above-described manner are released to the outside from the source electrodes S1, S2, S3, . . . , Sn by opening the TFTs 54 with input signals to the gate electrodes G1, G2, G3, . . . , Gn. Since all of the electrode wires (gate electrodes 52 and source electrodes 53), TFTs 54, and charge accumulating capacitors 55 are provided in an X-Y matrix arrangement, by linesequentially scanning input signals to the gate electrodes G1, G2, G3, . . . , Gn, 2-D image information of the X-rays can be obtained.

In case that the 2-D image detector employs the photoconductive film 56 which shows the photoconductivity to visible light or infrared light in addition to the radial rays, such as the X-rays, the 2-D image detector can also detect an image by using visible light or infrared light.

As has been mentioned, the conventional radiographic 2-D image detector uses a-Se as the photoconductive film 56, but a-Se has drawbacks that the responsivity is poor due to a unique property to an amorphous material, namely, dispersive photoconductivity for a photoelectric current, and that information can not be read out until the charge accumulating capacitors (Cs') 55 are fully charged by irradiating X-rays for a long time due to its poor sensitivity (S/N ratio) to X-rays.

The dielectric layer 57 is formed between the photoconductive film (a-Se) 56 and top electrode 58 so as to (1) prevent the charge accumulation in the charge accumulating capacitors 55 caused by a leak current during X-ray irradiation, (2) reduce a leak current (dark current), and (3) protect the components from a high voltage. In this case, however, a sequence to remove residual charges in the dielectric layer 57 in every frame is additionally necessary. Thus, the radiographic 2-D image detector has a problem that it can be used only to shoot still-frame images.

In order to obtain image data for motion pictures, instead of a-Se, the photoconductive film 56 must be made of a photoconductive crystalline (or poly-crystalline) material having excellent sensitivity (S/N ratio) to X-rays. By using the photoconductive film 56 with better sensitivity, the charge accumulating capacitors 55 can be fully charged by irradiating X-rays in a short time without applying a high voltage to the photoconductive film 56. Consequently, the dielectric layer 57 can be omitted.

Known examples of the photoconductive material with excellent sensitivity to X-rays are CdTe, CdZnTe, etc. In general, photoelectric absorption of X-rays is directly proportional to the fifth power of the effective atomic number of an absorbed substance. Thus, given 34 as the atomic number of Se and 50 as the effective atomic number of CdTe, then sensitivity improved by a factor of approximately 6.9 can be expected. However, when CdTe or CdZnTe is used as the photoconductive film 56 of the radiographic 2-D image detector instead of a-Se, the following problem occurs.

In conventional case of a-Se, a film can be readily formed on the active matrix substrate by means of vacuum deposition at room temperature. In contrast, in case of CdTe or CdZnTe, a film is formed by means of MBE (Molecular Beam Epitaxy) or MOCVD (Metal Organic Chemical Vapor Deposition), and particularly, the latter is considered suitable to form a film over a large-area substrate.

However, when a film of CdTe or CdZnTe is formed by means of MOCVD from raw materials including organic cadmium (DMCd), organic tellurium (DETe or DiPTe), etc., the film has to be formed at a temperature as high as 400° C. because the thermal decomposition temperature of DMCd is approximately 300° C., and those of DETe and DiPTe are approximately 400° C. and 350° C., respectively.

The TFT elements formed on the active matrix substrate are generally made out of a film of a-Si or p-Si with addition of hydrogen ($H_2$) at a temperature ranging from 300 to 350° C., so that the resulting TFT elements have better semiconductivity. The TFT elements thus formed can withstand temperatures up to 300° C., and if the TFT elements are heated above 300° C., hydrogen is released from the a-Si film or p-Si film, thereby deteriorating the semiconductivity.

Thus, it is quite difficult to form a film of CdTe or CdZnTe on the active matrix substrate by means of MOCVD because of the high film-forming temperature.

SUMMARY OF THE INVENTION

It is therefore an object of the present invention to provide a 2-D image detector with good responsivity and applicable for motion pictures by forming a semiconductor material, such as CdTe and CdZnTe, on the active matrix substrate at a low temperature of 300° C. or below.

In order to fulfill the above and other objects, a 2-D image detector of the present invention is characterized by being furnished with;

- an active matrix substrate having a pixel alignment layer including switching elements and charge accumulating capacitors having pixel electrodes connected to the switching elements;
- a counter substrate having an electrode layer and a photoconductive semiconductor layer, placed in such a manner that the semiconductor layer opposes the pixel alignment layer of the active matrix substrate; and
- a conductive connecting layer, provided between the active matrix substrate and counter substrate, for connecting the active matrix substrate to the counter substrate,
- at least one of the active matrix substrate and counter substrate being divided into a plurality of pieces.

According to the above arrangement, the active matrix substrate including the pixel alignment layer is electrically and physically connected to the counter substrate including the electrode sections and semiconductor layer. Hence, the active matrix substrate and counter substrate can be manufactured separately, thereby making it unnecessary to form the semiconductor layer directly on the active matrix substrate.

Accordingly, some kinds of materials having good sensitivity to radial rays, such as X-rays, visible light, infrared light, etc. could not have been used in conventional methods due to the withstand temperature of the switching elements, but the above arrangement allows the use of such materials as the semiconductor layer.

In addition, the 2-D image detector is arranged in such a manner that at least one of the active matrix substrate and counter substrate is divided into a plurality of pieces, and each of the smaller divided pieces can be manufactured inexpensively at high yield. Further, by dividing at least one of the substrates, a pressing force applied when connecting the two substrates by means of the conductive connecting layer can be reduced in accordance with the number of the divided pieces. For example, in case that the counter substrate is composed of 12 divided pieces which are laminated sequentially, a total of the pressing forces required to laminate the 12 divided pieces is smaller than the pressing force required to laminate the non-divided counter substrate by one digit or more.

Consequently, even if the areas of the active matrix substrate and counter substrate are enlarged, an increase of the manufacturing costs can be suppressed without lowering the yield. Further, since the pressing force required to connect the two substrates can be reduced, a pressing device can be downsized correspondingly. Moreover, the pressure can be more readily applied uniformly across the substrate composed of the divided pieces.

It should be noted that either the active matrix substrate or counter substrate is divided into a plurality of pieces, or the both substrates are divided into a plurality of pieces, and the cost can be saved in accordance with the number of divided pieces.

For a fuller understanding of the nature and advantages of the invention, reference should be made to the ensuing detailed description taken in conjunction with the accompanying drawings.

DESCRIPTION OF THE EMBODIMENTS

Embodiment 1

Referring to FIGS. 1 through 4, the following description will describe an example embodiment of the present invention.

Figure 1A:
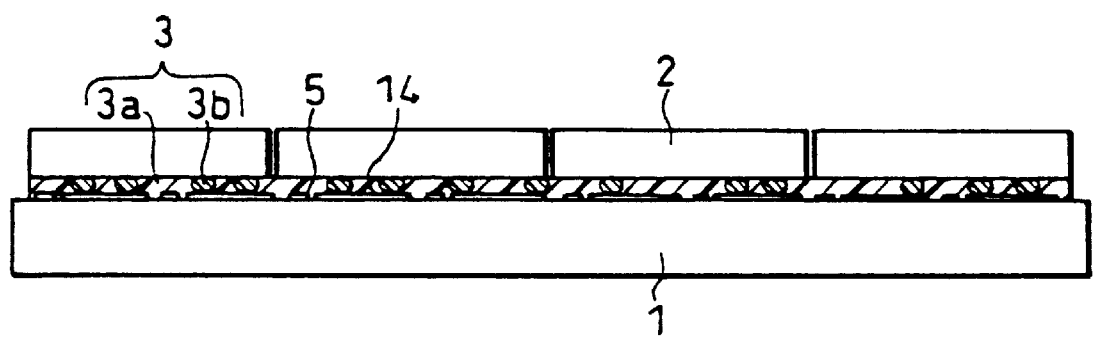
FIG. 1(a) is a cross section schematically showing an arrangement of an entire 2-D image detector in accordance with a first embodiment of the present invention and FIG. 1(b) is a plan view of the 2-D image detector.
Figure 1B:
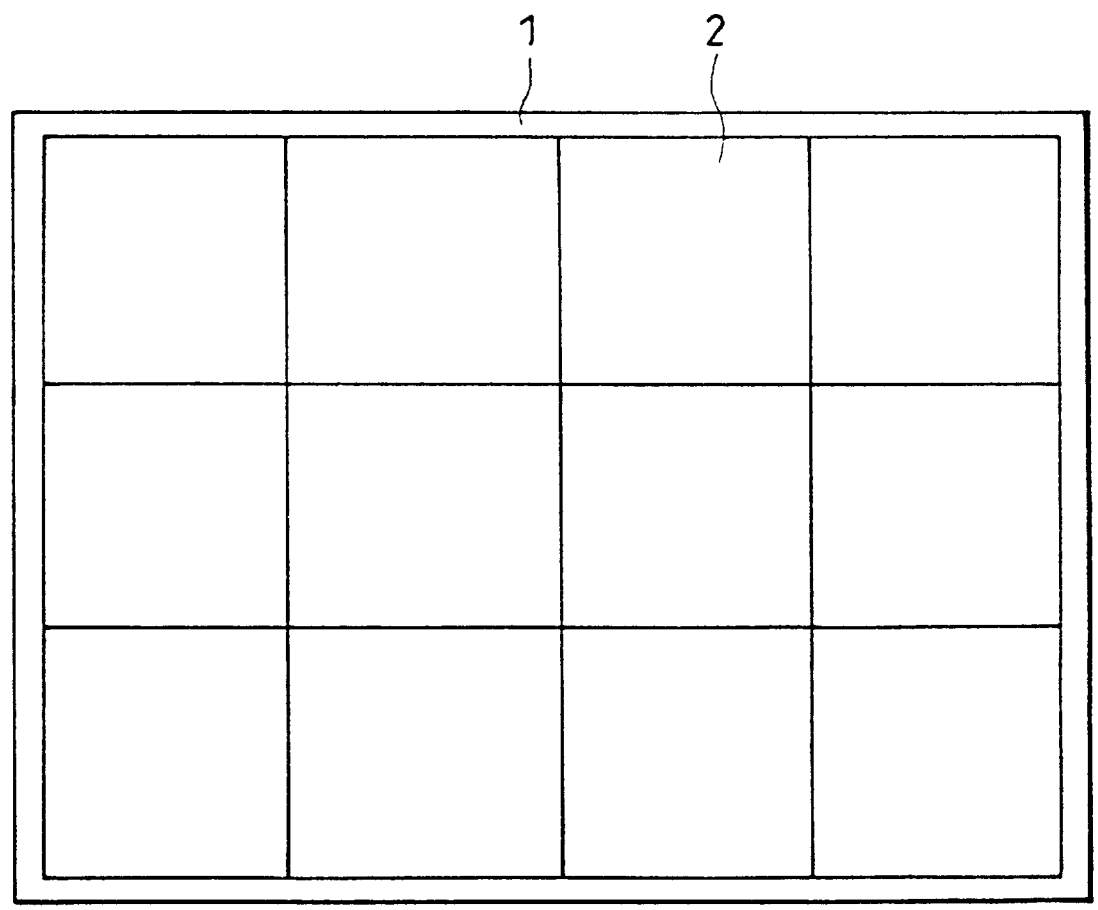
Figure 2:
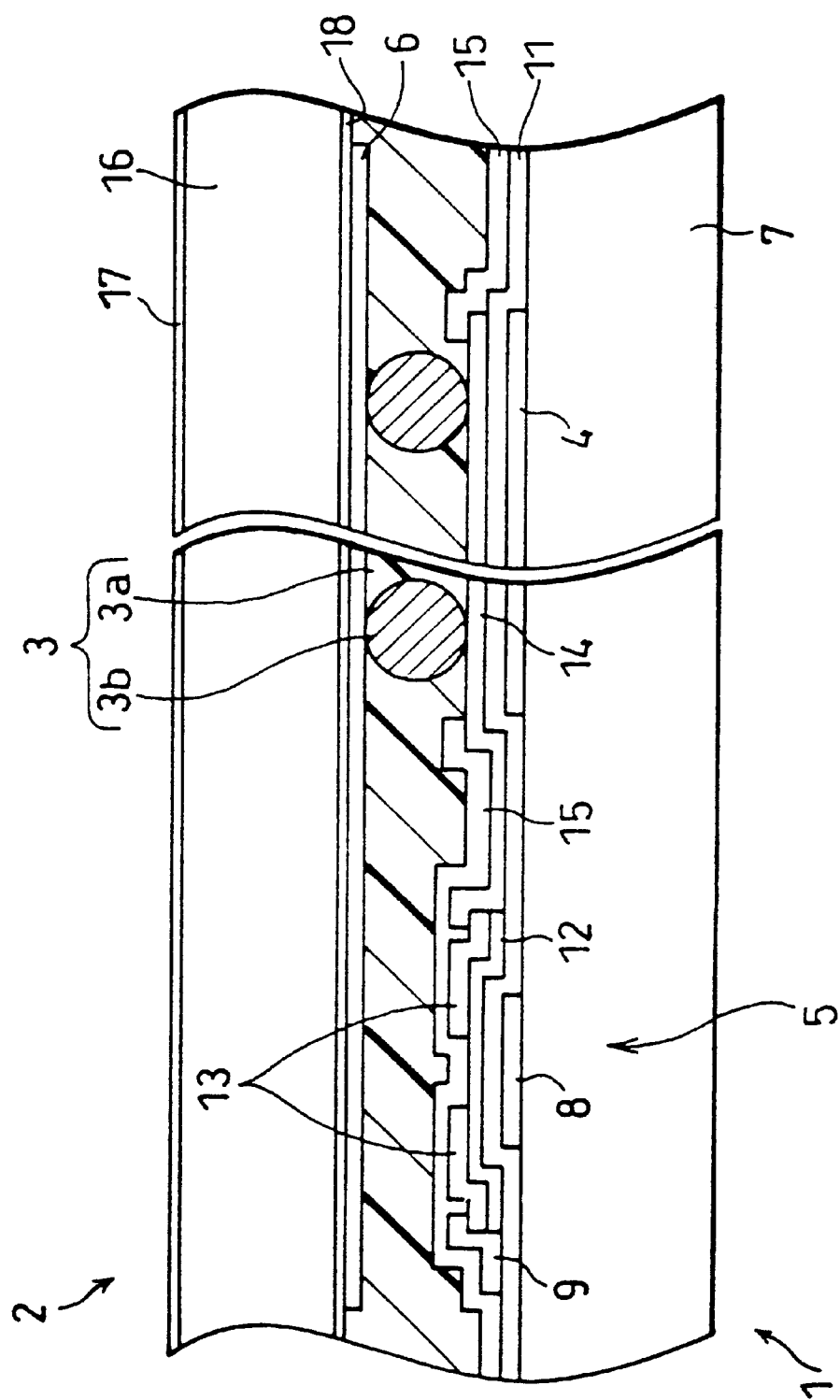
FIG. 2 is a cross section schematically showing an arrangement of each pixel of the 2-D image detector.

FIGS. 1(a) and 1(b), and FIG. 2 show an arrangement of a 2-D image detector in accordance with the present embodiment. FIG. 1(a) is a cross section schematically showing an arrangement of the entire 2-D image detector, and FIG. 1(b) is a plan view of the 2-D image detector seen from above (from a counter substrate 2 side). FIG. 2 is a cross section showing an arrangement of each pixel of the 2-D image detector of FIG. 1.

For ease of explanation, FIG. 1(a) shows only a small number of scaled-up pixels, but it should be appreciated that an actual 2-D image detector with an image-receiving area of 430 m×350 mm is provided with approximately six million pixels, for example.

As shown in FIG. 1(a), the 2-D image detector of the present embodiment comprises an active matrix substrate 1 on which are formed thin film transistors (TFTs) 5 serving as switching elements and pixel electrodes 14, and a counter substrate 2 on which are formed connecting electrodes (not shown), the substrates 1 and 2 being laminated to each other by means of an anisotropic conductive bonding agent (conductive connecting layer) 3 made of an anisotropic conductive material. The anisotropic conductive material referred herein encompasses materials having both conductivity and anisotropy, and the anisotropic conductive bonding agent 3 used in the present embodiment is a mixture of an insulating bonding agent 3a and conductive particles 3b.

The active matrix substrate 1 can be manufactured in the same process as that of an active matrix substrate for the liquid crystal display. To be more specific, as shown in FIG. 2, on a glass substrate 7, a pixel alignment layer is formed with an X-Y matrix of electrode wires (gate electrodes 8 and source electrodes 9), thin film transistors (TFTs) 5, and charge accumulating capacitors (Cs') composed of pixel electrodes 14 and charge accumulating capacitor electrodes (Cs electrodes) 4.

A non-alkali glass substrate (for example, Model #7059 or Model #1737 of Corning Inc.) is used as the glass substrate 7, and gate electrodes 8 are formed thereon out of a film of metal, such as Ta (tantalum). Here, a film of Ta having a thickness of approximately 3000 Å is formed by means of sputtering deposition, and the film is patterned on a desired shape, whereby the gate electrodes 8 are formed. The charge accumulating capacitor electrodes (Cs electrodes) 4 are formed simultaneously with the gate electrodes 8.

Then, an insulating film 11 made of SiNx or SiOx having a thickness of approximately 3500 Å is formed by means of CVD (Chemical Vapor Deposition). The insulating film 11 functions as a gate insulating film for the thin film transistors (TFTs) 5 and as a dielectric layer between the electrodes (charge accumulating capacitor electrodes (Cs electrodes) 4 and pixel electrodes 14) of the charge accumulating capacitors (Cs'). Besides SiNx and SiOx, the insulating film 11 can be an anodized film of the gate electrodes 8 and charge accumulating capacitor electrodes (Cs electrodes) 4.

Then, an a-Si film (i layer) 12 which will be made into a channel section of the thin film transistors (TFTs) 5, and an a-Si film (n+layer) 13 which establishes a contact between the a-Si film (i layer) 12 and the source-drain electrodes are formed by means of CVD in thicknesses of approximately 1000 Å and 400 Å, respectively. The films thus formed are patterned on their respective desired shapes.

Then, the source electrodes 9 and pixel electrodes 14 are formed out of a film of metal, such as Ta, Al (aluminium) and Ti (titanium). It should be noted that the pixel electrodes 14 also serve as the drain electrodes. Here, the metal film having a thickness of approximately 3000 Å is formed by means of sputtering deposition, and the film is patterned on a desired shape, whereby the source electrodes 9 and pixel electrodes 14 are formed. The pixel electrodes 14 and drain electrodes can be formed separately, and transparent electrodes made of ITO (Indium Tin Oxide), for example, can be used as the pixel electrodes 14.

Then, an insulating protector film 15 is formed to electrically isolate and thereby protect regions other than the opening of each pixel electrode 14. Here, the insulating film made of SiNx or SiOx and having a thickness of approximately 3000 Å is formed by means of CVD, and the film is patterned on a desired shape, whereby the insulating protector film 15 is formed. The insulating protector film 15 can be an insulating film made of an inorganic material, or an insulating film made of an organic material, such as acrylic and polyimide. In this manner, the active matrix substrate 1 is manufactured.

In the present embodiment, the TFTs 5 of an inversestagger structure made of a-Si are used as the TFT elements of the active matrix substrate 1. However, the TFT elements are not limited to the foregoing, and for example, they may be made of p-Si or of a stagger structure. In addition, the active matrix substrate 1 can be manufactured in the same process as that of manufacturing the active matrix substrate for the liquid crystal display.

On the other hand, as shown in FIG. 2, a supporting substrate of the counter substrate 2 is a semiconductor substrate (photoconductive substrate) 16 having photoconductivity for radial rays, such as X-rays. Compound semiconductors, such as CdTe and CdZnTe, are used herein. The semiconductor substrate 16 has a thickness of approximately 0.5 mm and can be readily formed as a crystalline substrate by the Bridgman method, gradient freezing method, or travel heating method.

The top electrode 17 is formed out of a conductive film, such as Au (gold), Pt, and ITO, entirely on one of the surfaces of the semiconductor substrate 16, while a charge blocking layer 18 having a thickness of approximately 300 Å is formed out of an insulating layer made of AlOx entirely on the other surface. Here, a film of metal, such as Au and ITO, having a thickness of approximately 2000 Å is formed by means of sputtering deposition, and the film is patterned on a desired shape, whereby the connecting electrodes 6 are formed. The connecting electrodes 6 are formed at positions corresponding to the pixel electrodes 14 formed on the active matrix 1.

In the present embodiment, as shown in FIGS. 1(a) and 1(b), the counter substrate 2 is divided into 12 pieces and each piece is approximately 1/12 of the active matrix substrate 1 in size. The 12 pieces tiled as panes form the counter substrate 2 which is substantially as large as the active matrix substrate 1.

The active matrix substrate 1 and counter substrate 2 thus manufactured are provided in such a manner that the pixel electrode 14 opposes the connecting electrode 6 in each pixel, and as shown in FIG. 2, the anisotropic conductive bonding agent 3 is provided in a space between the two substrates 1 and 2. The anisotropic conductive bonding agent 3 electrically connects the pixel electrodes 14 formed on the active matrix substrate 1 and the connecting electrodes 6 formed on the counter substrate 2.

Figure 3A:
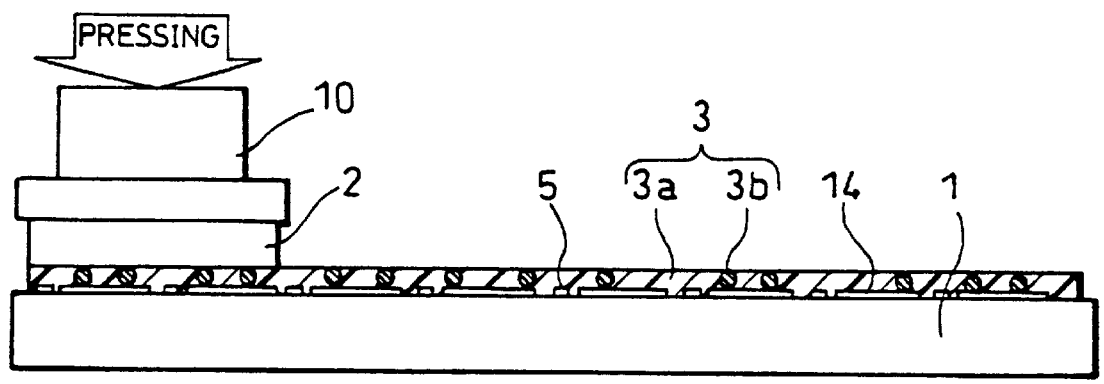
FIGS. 3(a) through 3(c) are views showing a process of laminating an active matrix substrate and a counter substrate forming the 2-D image detector.
Figure 3B:
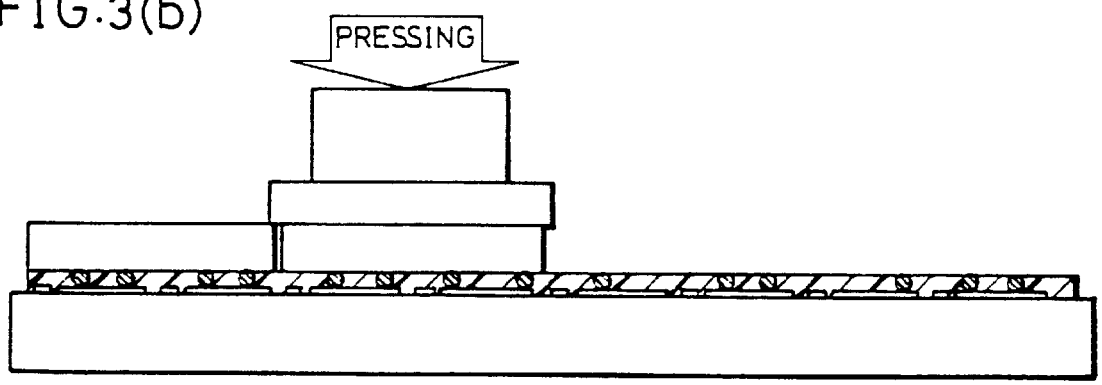
Figure 3C:
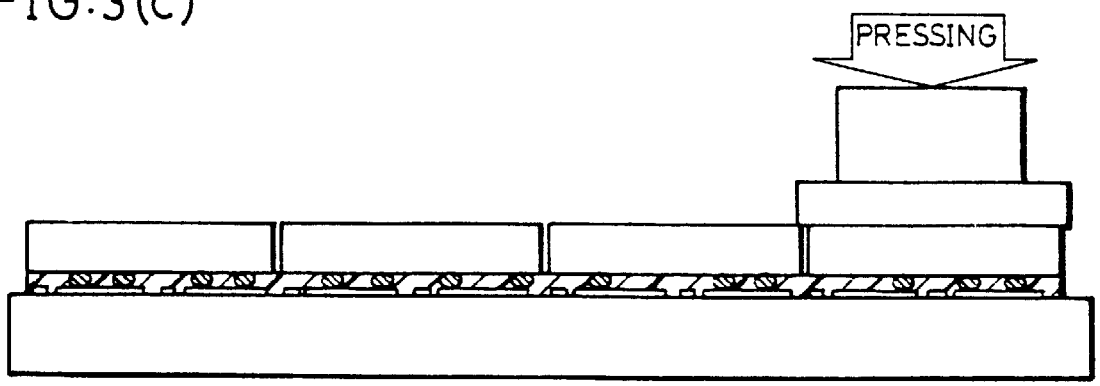

Next, with reference to FIGS. 3(a) through 3(c), the following will explain more in detail how the above-explained active matrix substrate 1 and counter substrate 2 are laminated to each other.

Initially, the anisotropic conductive bonding agent 3, which will be described below, is applied or transferred onto the active matrix substrate 1. Then, as shown in FIGS. 3(a) through 3(c), 12 divided pieces of the counter substrate 2 are sequentially pressed against the active matrix substrate 1 by a heat presser 10, whereby the substrates 1 and 2 are laminated to each other in such a manner that the connecting electrodes 6 and pixel electrodes 14 are placed at matching positions. The 2-D image detector of the present embodiment is manufactured when all the 12 divided pieces of the counter substrate 2 are laminated to the active matrix substrate 1.

The anisotropic conductive bonding agent 3 is not necessarily provided on the active matrix substrate 1, and can be provided on the counter substrate 2 instead. In addition, a space between a plurality of divided pieces of the counter substrate 2 may be filled with a bonding agent to reinforce mechanical strength.

Next, the following will explain more in detail the anisotropic conductive bonding agent 3 used in the present embodiment. The anisotropic conductive bonding agent 3 used herein is a mixture of the insulating bonding agent 3a and the conductive particles 3b dispersed therein.

Available examples of the conductive particles 3b are:

particles of metal, such as Ni (nickel) and Ag (silver);

Au-plated particles of metal, such as Ni;

carbon particles;

plastic particles coated with a metal film, such as Au/Ni-plated plastic particles;

transparent conductive particles made of ITO or the like;

compound plastic with conductive particles, such as polyurethan blended with Ni particles; etc.

In the present embodiment, plastic particles coated with a metal film having excellent elasticity are used, so that irregularities in thickness of the two vertically laminated substrates (active matrix substrate 1 and counter substrate 2) can be absorbed therein.

The bonding agent 3a used herein can be of a thermosetting, thermo-plastic, or photo-setting type. In the present embodiment, an epoxy thermo-setting type bonding agent is chosen because of its good bonding strength and high reliability.

The anisotropic conductive bonding agent 3 can be either paste or a film. Paste of the bonding agent can be readily applied on a large-area substrate by means of screen printing. On the other hand, a film of the bonding agent can intrinsically maintain a constant thickness, and therefore, can readily maintain a constant thickness when used in laminating the large-area substrates. In the present embodiment, either is applicable, and a film of the bonding agent is chosen.

Besides the foregoing, the anisotropic conductive bonding agent 3 of the present embodiment can be a recently developed anisotropic conductive bonding agent, such as an insulating bonding film provided with a plurality of fine metal columns piercing through the film (anisotropic conductive bonding agents disclosed in, for example, Japanese Laid-Open Patent Application No. 306415/1996, Japanese Official Gazette, Tokukaihei No. 8-306415, published on Nov. 22, 1996).

Figure 4:
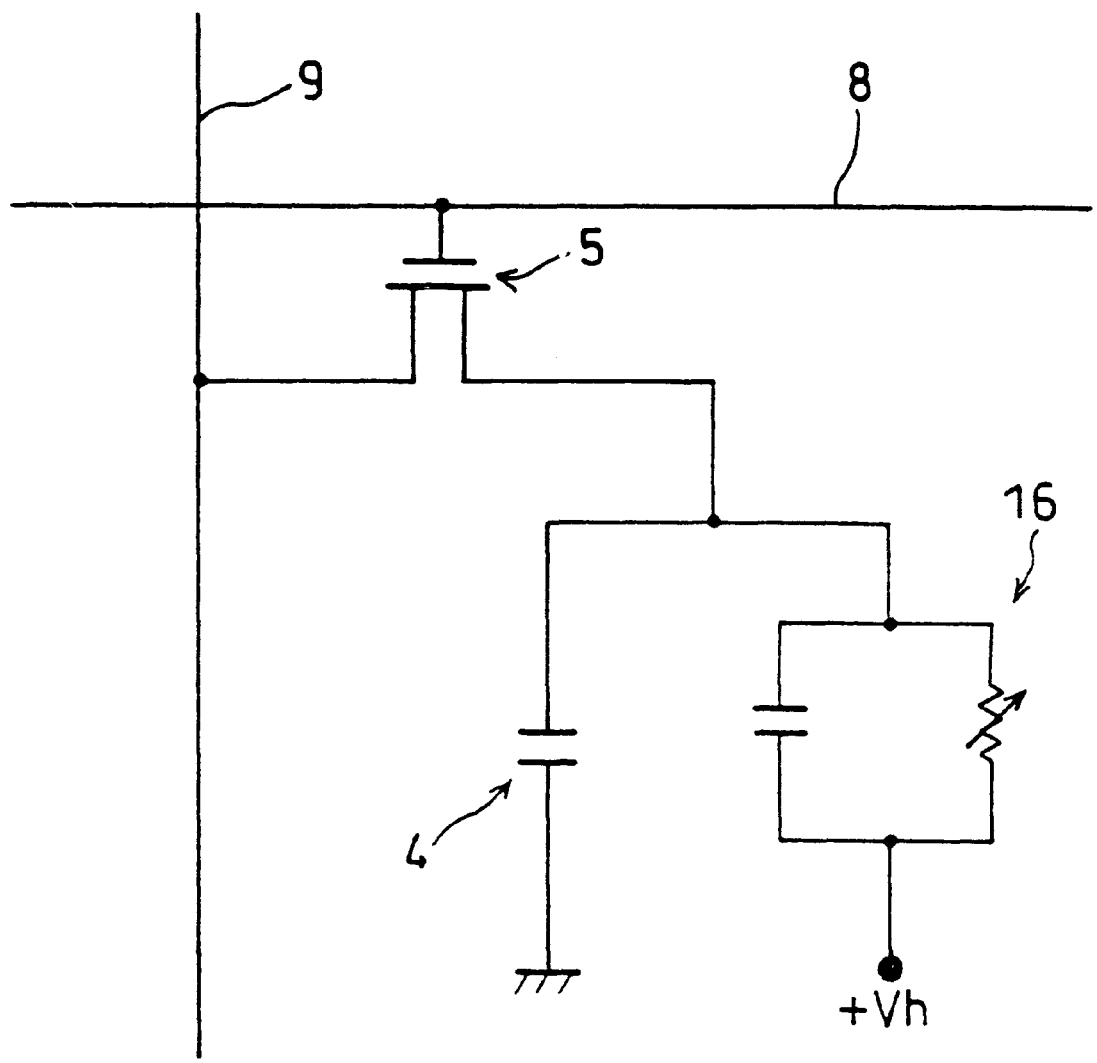
FIG. 4 is a circuit diagram showing an equivalent circuit for each pixel of the 2-D image detector.

Next, the following will explain the operation principle of the above-described 2-D image detector with reference to FIGS. 2 and 4. FIG. 4 is a circuit diagram showing an equivalent circuit for each pixel of the 2-D image detector of the present embodiment.

Upon incidence of X-rays, the semiconductor substrate (photoconductive substrate) 16 made of CdTe or CdZnTe starts to generate charges (electrons-holes) by a photoconducting effect. Here, the charge accumulating capacitor electrodes (Cs electrodes) 4 and semiconductor substrate (photoconductive substrate) 16 are connected in series through the pixel electrodes 14, anisotropic conductive bonding agent 3, and connecting electrodes 6. Thus, when a voltage is applied across the top electrode 17 and charge accumulating capacitor electrodes (Cs electrodes) 4, the charges (electrons-holes) generated in the semiconductor substrate 16 start to migrate to the positive electrode end and negative electrode end, whereby the charges are accumulated in the charge accumulating capacitors (Cs') composed of the pixel electrodes 14 and charge accumulating capacitor electrodes (Cs electrodes) 4.

The charge blocking layer 18 made of a thin insulating layer is formed between the semiconductor substrate 16 and connecting electrodes 6. The charge blocking layer 18 functions as a blocking photodiode of an MIS (Metal-Insulator-Semiconductor) structure to prevent the charge injection from one of the surfaces thereof, and contributes to reduction of a dark current when X-rays are not incident. In other words, when a positive voltage is applied to the top electrode 17, the charge blocking layer 18 prevents the injection of electrons from the connecting electrodes 6 to the semiconductor substrate (photoconductive substrate) 16.

Alternatively, if an insulating layer is additionally provided between the semiconductor substrate (photoconductive substrate) 16 and top electrode 17, the injection of holes from the top electrode 17 to the semiconductor substrate (photoconductive substrate) 16 can be also prevented, thereby reducing the dark current further.

Besides the MIS structure, the blocking photodiode can be of a hetero jointing structure using a lamination film of CdTe/CdS or the like, a PIN jointing structure, or a Schottky jointing structure.

Figure 12:
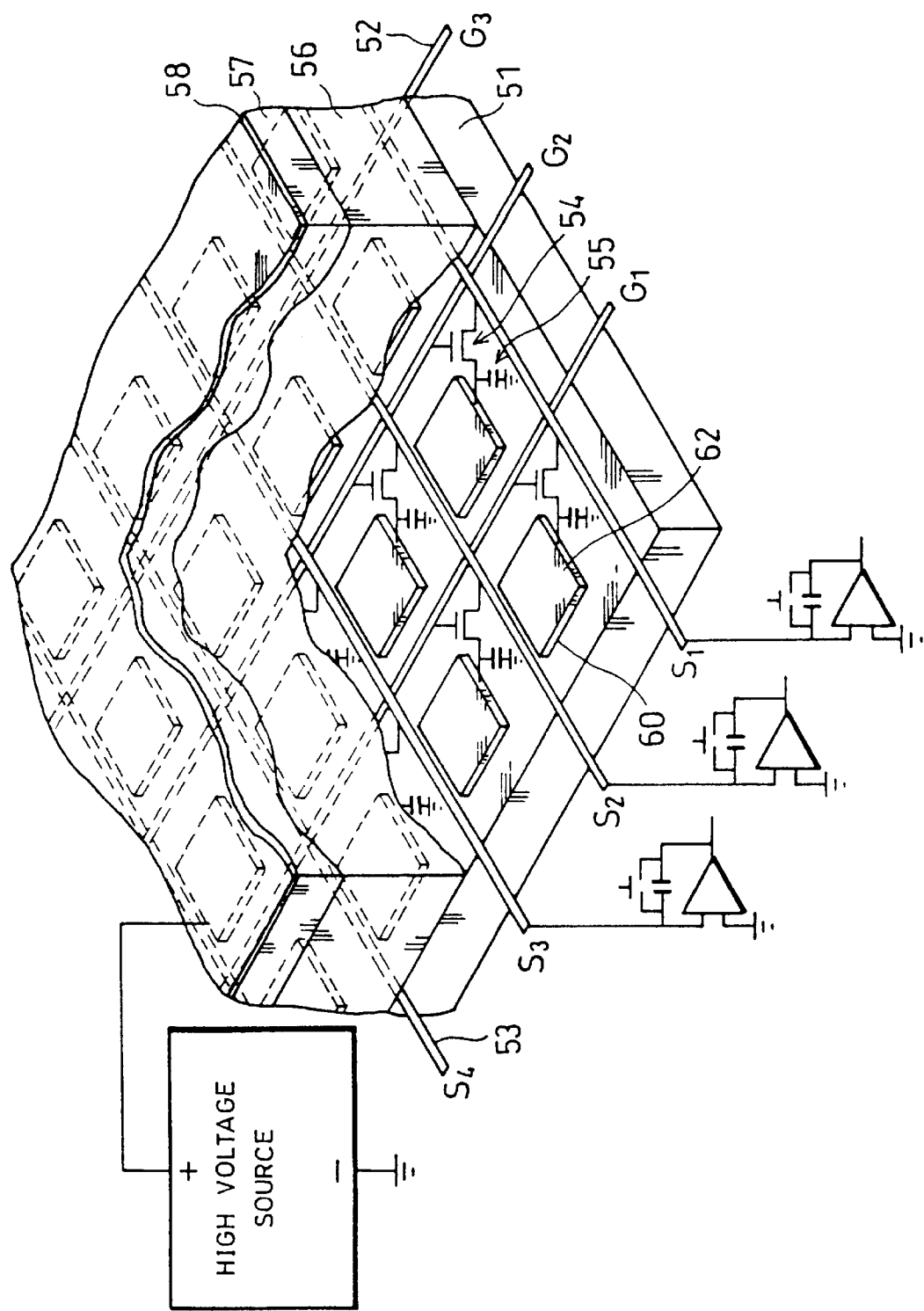
FIG. 12 is a view schematically explaining an arrangement of a conventional 2-D image detector.
Figure 13:
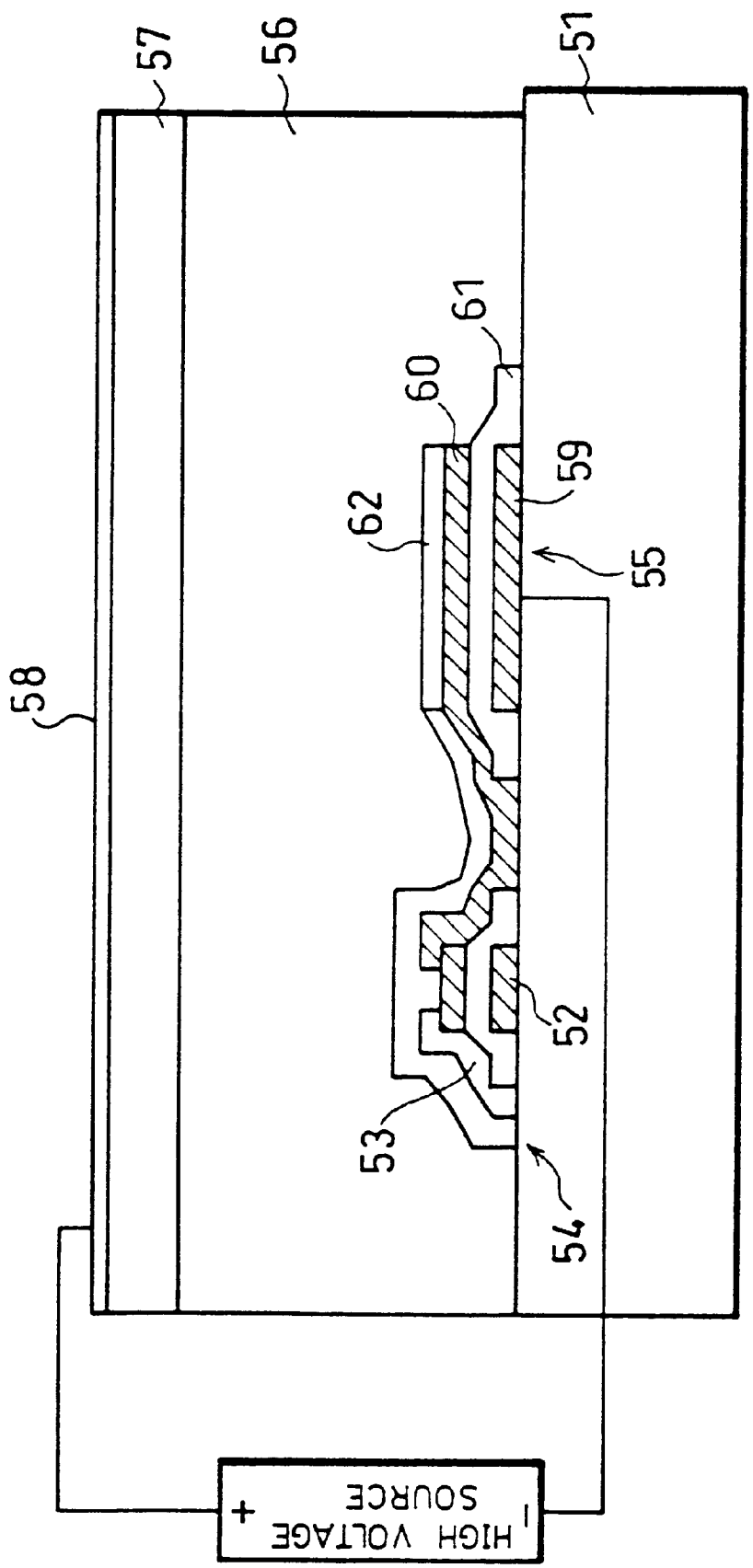
FIG. 13 is a cross section schematically showing an arrangement of each pixel of the conventional 2-D image detector.

As has been mentioned, the charges accumulated in the charge accumulating capacitors (Cs') can be released to the outside from the source electrodes 9 by opening the thin film transistors (TFTs) 5 with input signals to the gate electrodes 8. As is illustrated in FIG. 12 of the conventional example, all of the electrode wires (gate electrodes 8 and source electrodes 9), thin film transistors (TFTs) 5, and charge accumulating capacitors (Cs') having the charge accumulating capacitor electrodes (Cs electrodes) 4 and pixel electrodes 14 as the electrodes are provided in an X-Y matrix arrangement. According to this arrangement, by line-sequentially scanning the input signals to the gate electrodes G1, G2, G3, . . . , Gn, 2-D image information of X-rays can be obtained. As has been discussed, the operating principle of the 2-D image detector of the present embodiment is identical with that of the conventional 2-D image detector.

As can be understood from the foregoing, the 2-D image detector of the present embodiment is characterized in that: the active matrix substrate 1 provided with a matrix of electrode wires (gate electrodes 8 and source electrodes 9), a plurality of thin film transistors (TFTs) 5 individually formed at the intersections of the matrix, and a plurality of pixel electrodes 14 is electrically connected to the counter substrate 2 whose surface is covered almost entirely with the photoconductive semiconductor substrate (photoconductive substrate) 16 by means of the anisotropic conductive bonding agent 3 made of the bonding agent 3a and the conductive particles 3b dispersed therein.

Thus, a problem of the conventional 2-D image detector, namely, the restriction of the film forming temperature of the photoconductor imposed due to the heat resistance of the active matrix substrate, is eased by the arrangement of the present embodiment. Consequently, a semiconductor material which could not have been used to form a film on the active matrix substrate by the conventional method can be readily used for the 2-D image detector.

Since CdTe or CdZnTe can be used as the semiconductor substrate (photoconductive substrate) 16 for the reasons specified above, the sensitivity to X-rays can be improved compared with the conventional 2-D image detector using a-Se. Further, since the dielectric layer between the semiconductor substrate 16 and top electrode 17 can be omitted, the image data corresponding to motion pictures can be obtained, in other words, the image data can be obtained at a rate of 33 msec/frame.

The present embodiment has described a case where the counter substrate 2 employs the semiconductor substrate (photoconductive substrate) 16 as the supporting substrate. As has been described, the semiconductor substrate 16 can be a crystalline substrate produced by the Bridgman method, gradient freezing method, or travel heating method, but a large-area crystalline substrate can not be manufactured at a low cost because a significant capital investment is required.

The counter substrate 2 can be replaced with another counter substrate having an independent supporting substrate on which the semiconductor film is formed. However, even in this case, a semiconductor film as thick as 100 μm or more has to be formed, and film stress which rises with enlarging area frequently causes deficiencies, such as film separation and in-plane irregularities in thickness and quality of the film, thereby making it difficult to manufacture inexpensive counter substrates.

In order to solve such inconveniences, the counter substrate 2 is composed of 12 divided pieces in the present embodiment, and therefore, the 2-D image detector can be manufactured using a general semiconductor wafer. Moreover, since the counter substrate 2 is divided into 12 pieces, a film-forming substrate area on each piece can be reduced. Consequently, film forming yield can be improved, and accordingly, the counter substrate 2 can be manufactured at a low cost.

The counter substrate 2 does not have to be divided into 12 pieces, and it can be divided into any arbitrary number of pieces depending on the size of the 2-D image detector or the price of a crystalline wafer. Further, the shape of the divided pieces of the counter substrate 2 is not limited to a rectangle, and hexagonal pieces may be cut out from circular crystalline wafers, so that these pieces aligned at the closest packing form the substrate.

The anisotropic conductive bonding agent 3 generally demands a curing process, in which the anisotropic conductive bonding agent 3 is cured while it is sandwiched by the substrates 1 and 2 and pressed under a pressure ranging from 10 to 30 kgf/cm$^2$. This process is necessary to stabilize the conduction by deforming the conductive particles 3b dispersed in the anisotropic conductive bonding agent 3 to some extent, thereby enlarging a contact area with the electrodes (pixel electrodes 14 and connecting electrodes 6) formed on the vertically laminated two substrates (active matrix substrate 1 and counter substrate 2).

When large-area substrates are laminated to each other by means of the anisotropic conductive bonding agent 3, a pressing force rises sharply with enlarging area while the pressing force has to be applied uniformly. Accordingly, in order to handle a large-area substrate, a conventional pressing device has to be upsized. For example, if substrates of 430 mm×350 mm are laminated by means of the anisotropic conductive bonding agent 3 which requires a pressing force of 20 kgf/cm$^2$, then a pressing force of approximately 30000 kgf/cm$^2$ has to be applied.

However, if the counter substrate 2 is divided into a plurality of pieces like in the 2-D image detector of the present embodiment, the pressing force can be reduced corresponding to the number of divided pieces. To be more specific, by sequentially laminating the 12 divided pieces of the counter substrate 2, a pressing force as low as 2500 kgf/cm$^2$ is sufficient for each piece, thereby making it possible to reduce the pressing force to $1/10$ or less. Moreover, the pressing device can be downsized. Further, since the area of each divided piece of the counter substrate 2 is $1/12$ of the entire area of the counter substrate 2, a pressure can be more readily applied uniformly across the plane.

Embodiment 2

The 2-D image detector of the present invention is not limited to the one as shown in FIGS. 1 and 2, and can be modified adequately. Hence, with reference to FIGS. 5 through 7, the following will describe Embodiment 2 of the present invention, which relates to a 2-D image detector arranged differently from its counterpart in Embodiment 1.

Figure 5A:
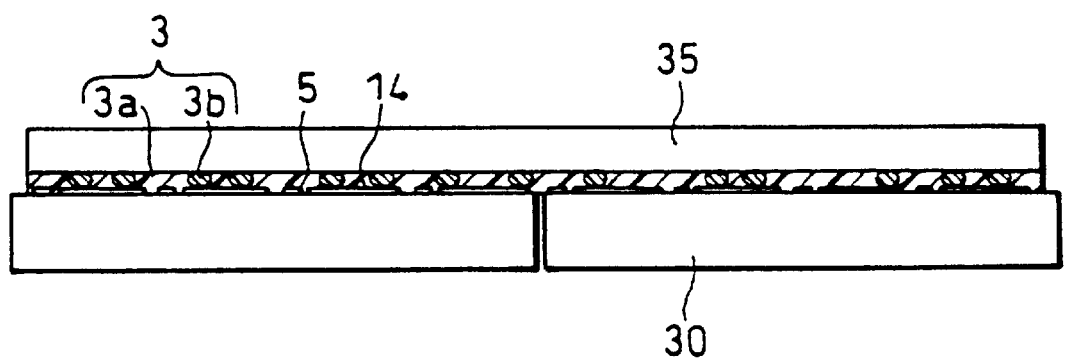
FIG. 5(a) is a cross section schematically showing an arrangement of an entire 2-D image detector in accordance with a second embodiment of the present invention and FIG. 5(b) is a plan view of the 2-D image detector.
Figure 5B:
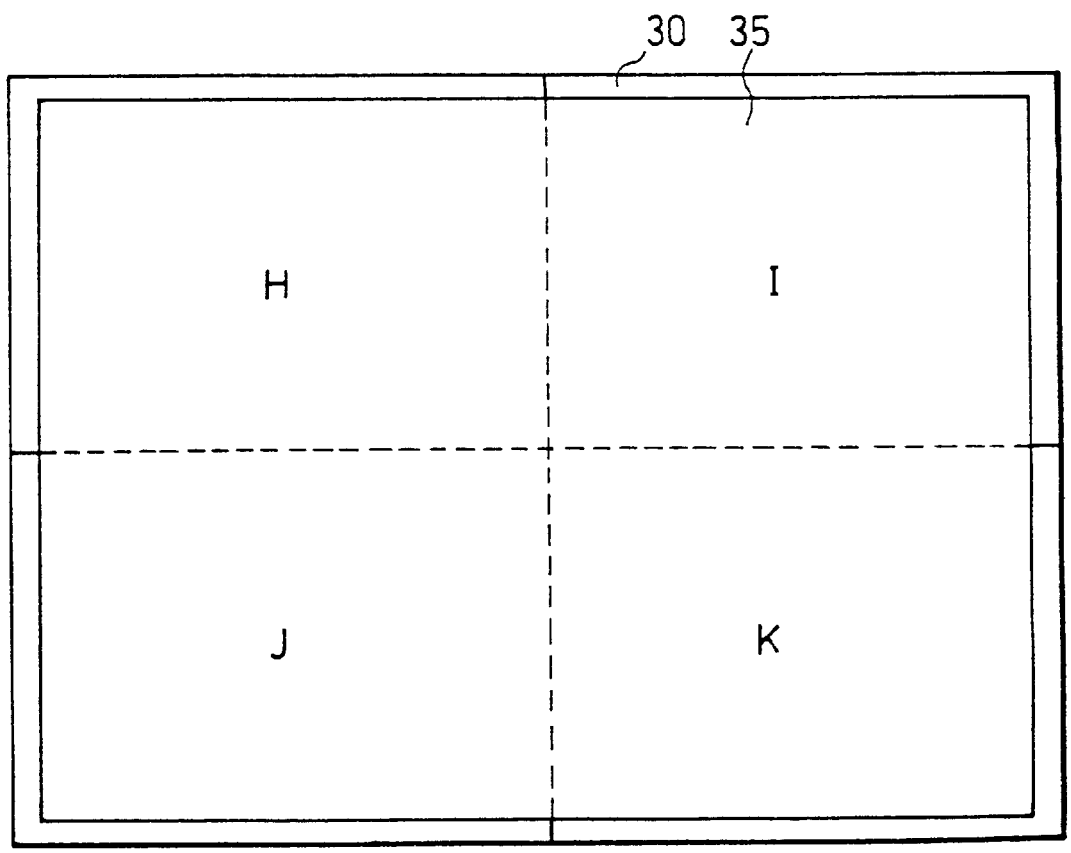
Figure 6:
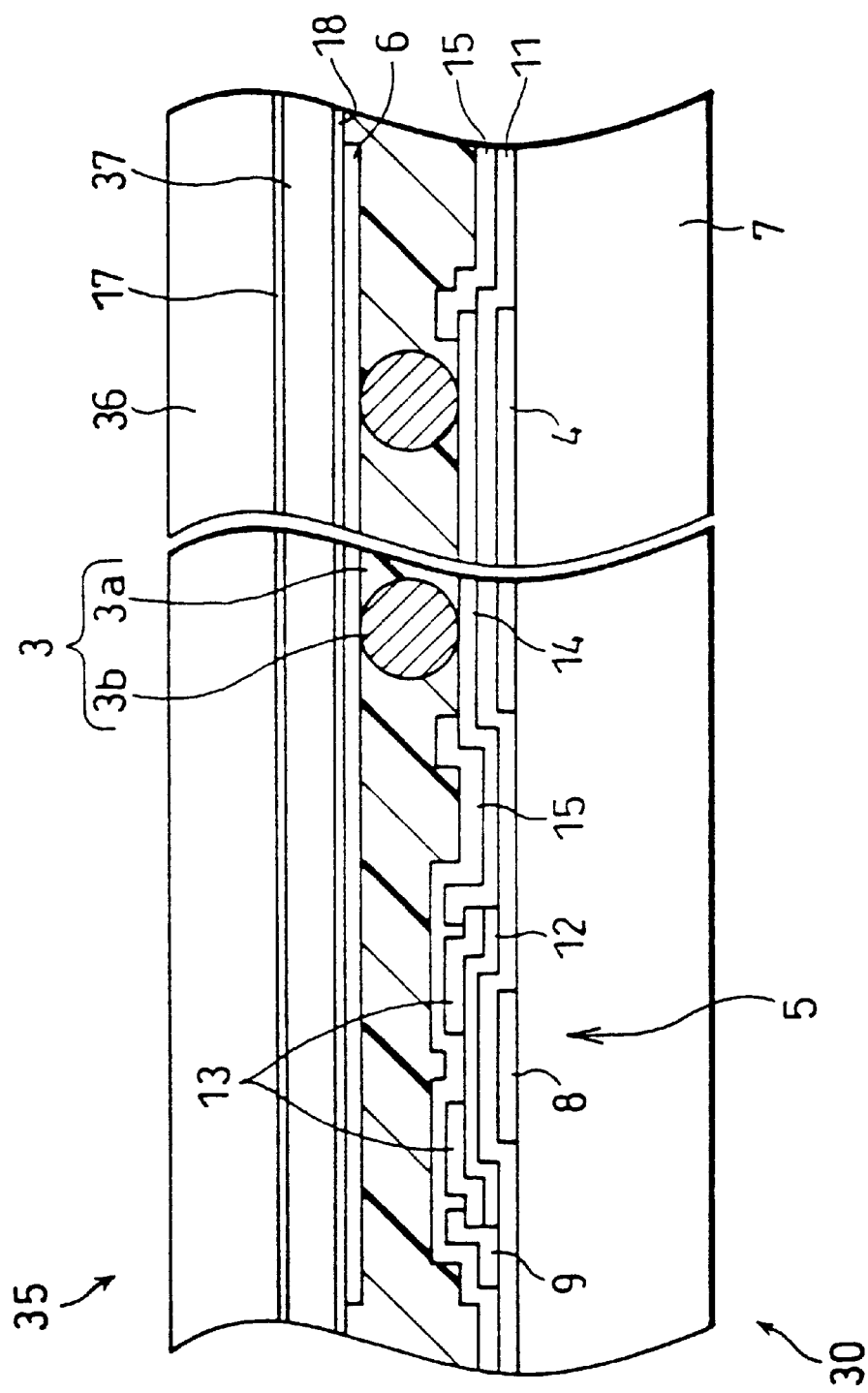
FIG. 6 is a cross section schematically showing an arrangement of each pixel of the 2-D image detector.

FIGS. 5(a) and 5(b) and FIG. 6 show a 2-D image detector in accordance with the present embodiment. FIG. 5(a) is a cross section schematically showing an arrangement of the entire 2-D image detector, and FIG. 5(b) is a plan view of the 2-D image detector seen from above (from a counter substrate 35 side). FIG. 6 is a cross section showing an arrangement of each pixel of the 2-D image detector shown in FIGS. 5(a) and 5(b).

Since the 2-D image detector of the present embodiment is similar to its counterpart in Embodiment 1 shown in FIGS. 1(a) and 1(b) and FIG. 2, like components are labeled with like reference numerals with respect to FIGS. 1(a) and 1(b) and FIG. 2, and the description of these components is not repeated herein for ease of explanation.

As shown in FIG. 5(a), the 2-D image detector of the present embodiment comprises an active matrix substrate 30 provided with the thin film transistors (TFTs) 5 serving as switching elements and pixel electrodes 14 laminated to a counter substrate 35 provided with connecting electrodes (not shown) by means of the anisotropic conductive bonding agent 3 made of an anisotropic conducting material. The anisotropic conductive bonding agent 3 used in the present embodiment is a mixture of the insulating bonding agent 3a and conductive particles 3b dispersed therein.

The active matrix substrate 30 is basically the same as the active matrix substrate 1 of Embodiment 1 except that the active matrix substrate 30 is divided into four pieces. Since the active matrix 30 is composed of the same components as those of the active matrix substrate 1 of Embodiment 1, the description of these components is omitted herein for ease of explanation.

The counter substrate 2 of Embodiment 1 is arranged to have the semiconductor substrate (photoconductive substrate) 16 as the supporting substrate. In contrast, the counter substrate 35 of the present embodiment is arranged in such a manner that a semiconductor film 37 is formed on an independent supporting substrate 36.

To be more specific, as shown in FIG. 6, the supporting substrate 36 has to be a substrate which can transmit X-rays, such as a glass substrate, a ceramic substrate, and a silicon substrate. Herein, a glass substrate having a thickness ranging from 0.7 to 1.1 mm and capable of transmitting both X-rays and visible light in a satisfactory manner is used. Such a glass substrate can transmit most of X-rays in a range between 40 and 100 keV.

Then, the top electrode 17 is formed out of a conductive film of Ti, Au, Pt, ITO, etc. on one of the surfaces of the supporting substrate 36 almost entirely. Note that, however, when the 2-D image detector is used to detect an image by using visible light, a transparent ITO electrode for visible light is used as the top electrode 17.

Then, a poly-crystalline film of CdTe or CdZnTe having a thickness of approximately 0.5 mm is formed on the top electrode 17 as the semiconductor film 37 by means of MOCVD (Metal Organic Chemical Vapor Deposition). MOCVD is suitable to form a film over a large-area substrate at a temperature ranging from 400 to 500° C. from raw materials, such as organic cadmium (dimethyl cadmium [DMCd], etc.), organic tellurium (diethyl tellurium [DETe], diisopropyl tellurium [DiPTe], etc.), organic zinc (diethyl zinc [DEZn], diisopropyl zinc [DiPZn], dimethyl zinc [DMZn], etc.).

Further, after the charge blocking layer 18 made of a thin insulating layer of AlOx is formed almost entirely on the poly-crystalline film, a film of metal, such as Au and ITO, is formed in a thickness of approximately 2000 Å and patterned on a desired shape, whereby the connecting electrodes 6 are formed. It is preferable to form the connecting electrodes 6 at positions corresponding to the pixel electrodes 14 formed on the active matrix substrate 30.

In the present embodiment, as has been described above, each divided piece of the active matrix 30 is approximately ¼ of the counter substrate 35 in size. Thus, four divided pieces of the active matrix substrate 30 tiled as panes form the active matrix substrate 30 substantially as large as the counter substrate 35.

The four divided pieces of the active matrix substrate 30 and the above-arranged counter substrate 35 are positioned in such a manner that the pixel electrode 14 and connecting electrode 6 oppose each other in each pixel area like in Embodiment 1, and laminated to each other by interposing the anisotropic conductive bonding agent 3 between the two substrates 30 and 35 in the manner as illustrated in FIG. 6, whereby the 2-D image detector of the present embodiment is manufactured.

The laminating method of the substrates 30 and 35 is similar to the one explained in Embodiment 1 with reference to FIG. 3. In the present embodiment, however, after the anisotropic conductive bonding agent 3 is applied or transferred onto the counter substrate 35, the four divided pieces of the active matrix substrate 30 are sequentially laminated to the counter substrate 35 in such a manner that the connecting electrodes 6 and pixel electrodes 14 are placed at the corresponding (matching) positions. The 2-D image detector of the present embodiment is manufactured when all the four divided pieces of the active matrix substrate 30 have been laminated.

Since the kinds of the anisotropic conductive bonding agent 3 used herein and the basic operation principle of the 2-D image detector thus manufactured are identical with those explained in Embodiment 1, the description of which is omitted herein for ease of explanation.

As has been discussed, the present embodiment is characterized in that the active matrix substrate 30 is divided into four pieces. The manufacturing process of the active matrix substrate 30 involves highly-sophisticated manufacturing technique, such as fine treatment by using the semiconductor, and for this reason, yield in the manufacturing process drops sharply with enlarging area, thereby causing a problem that the cost is undesirably increased.

However, if the active matrix substrate 30 is divided into a plurality of pieces like in the 2-D image detector of the present embodiment, since an area of each divided piece is reduced, the 2-D image detector can be manufactured inexpensively at high yield. In addition, by forming the active matrix substrate 30 with divided pieces, a pressing force can be reduced in accordance with the number of divided pieces when laminating the two substrates by means of the anisotropic conductive bonding agent 3, and there can be attained an effect that a pressure can be applied uniformly across the plane.

A space between the divided pieces of the active matrix substrate 30 can be filled with a bonding agent so as to reinforce mechanical strength of the active matrix substrate 30.

The active matrix substrate 30 does not have to be divided into four pieces, and it can be divided into any arbitrary number of pieces depending on the size of the 2-D image detector or the price of a crystalline wafer. However, in case that the wires are provided in an X-Y matrix arrangement, it is preferable to divide the same into two or four pieces, because the pull-out sections of the gate wires and source wires have to be formed around the circumference of the wiring area of the active matrix substrate 30.

Figure 7:
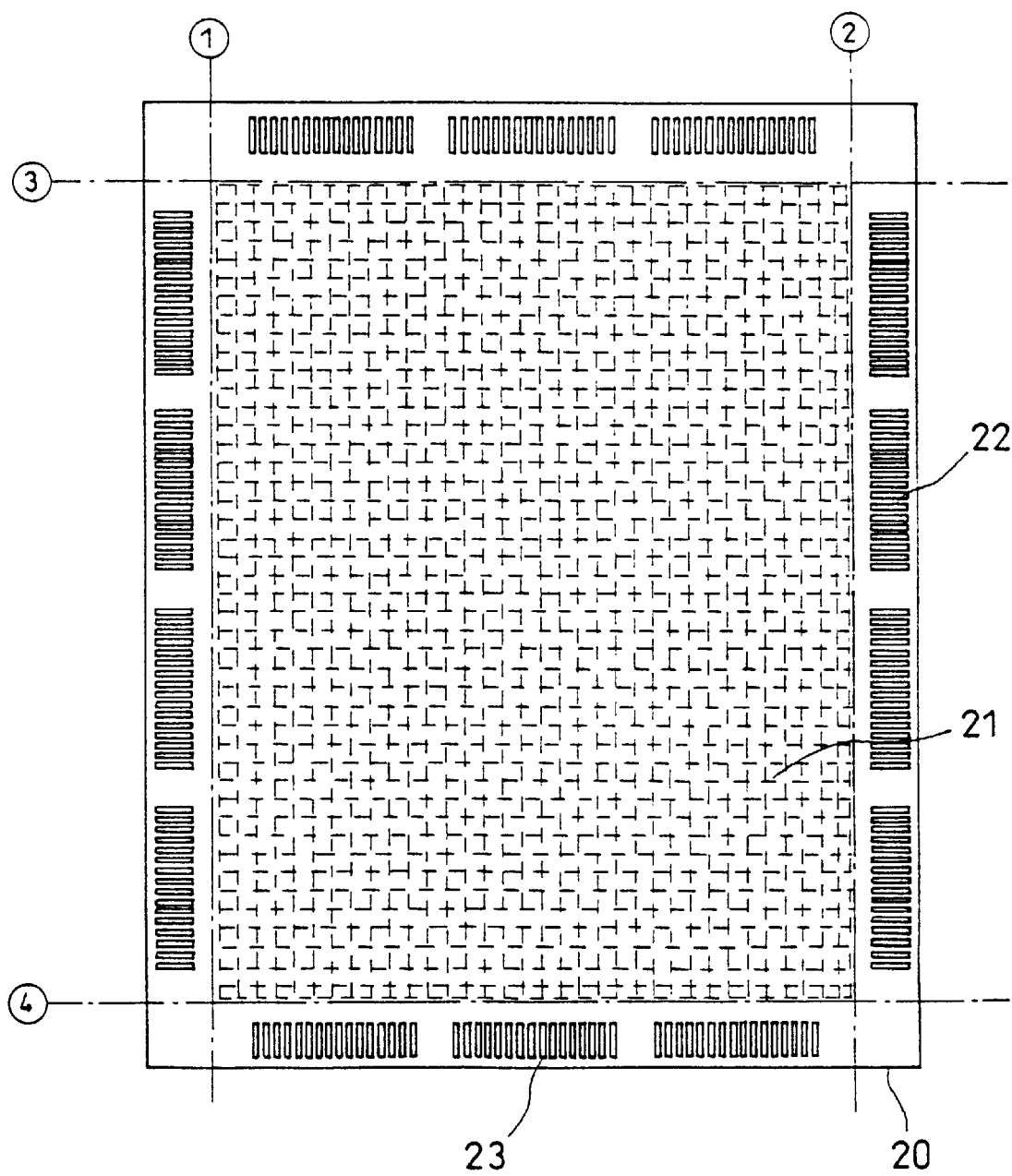
FIG. 7 is a plan view showing a mother substrate, out of which divided pieces of the substrate are produced.

FIG. 7 is a plan view showing a mother substrate 20 used to manufacture the active matrix substrate 30 composed of a plurality of divided pieces. In the drawing, numeral 21 denotes an area where the matrix wires are provided, and numerals 22 and 23 denote the pull-out sections of the source wires (gate wires) and gate wires (source wires), respectively.

The cost-saving effect obtained by dividing the substrate is reduced considerably if four divided pieces of substrates are manufactured separately in accordance with their specific wire patterns corresponding to their respective positions. Thus, as shown in FIG. 7, by cutting specific portions of a plurality of mother substrates 20 having a single wire pattern, the divided pieces of the active matrix substrate 30 corresponding to their respective positions can be obtained. Consequently, the cost-saving effect obtained by dividing the active matrix substrate 30 into a plurality of pieces can be fully appreciated.

For example, the mother substrate 20 of FIG. 7 cut along lines ① and ④ is used as the divided piece denoted by a capital letter H of the active matrix substrate 30 shown in the plan view of FIG. 5(b). Likewise, the mother substrate 20 cut along lines ① and ③ is used as the divide piece denoted by a capital letter I, and the mother substrates 20 cut along lines ②and ④and lines ②and ③are used as the divided pieces denoted by capital letters J and K, respectively.

Hence, it is not necessary to separately manufacture the divided pieces of the active matrix substrate 30 in accordance with their specific wire patterns, and instead, the divided pieces of the active matrix substrate 30 can be manufactured out of the mother substrates 20 of a single kind corresponding to their respective positions.

Embodiment 3

The 2-D image detector of the present invention is not limited to those shown in FIGS. 1(*a*) and 1(*b*) and FIG. 2, and in FIGS. 5(*a*) and 5(*b*) and FIG. 6, and can be modified adequately. So, with reference to FIGS. 8(*a*) and 8(*b*) and FIG. 9, the following will describe Embodiment 3 of the present invention, which is in effect a 2-D image detector arranged differently from its counterparts in Embodiments 1 and 2.

Figure 8A:
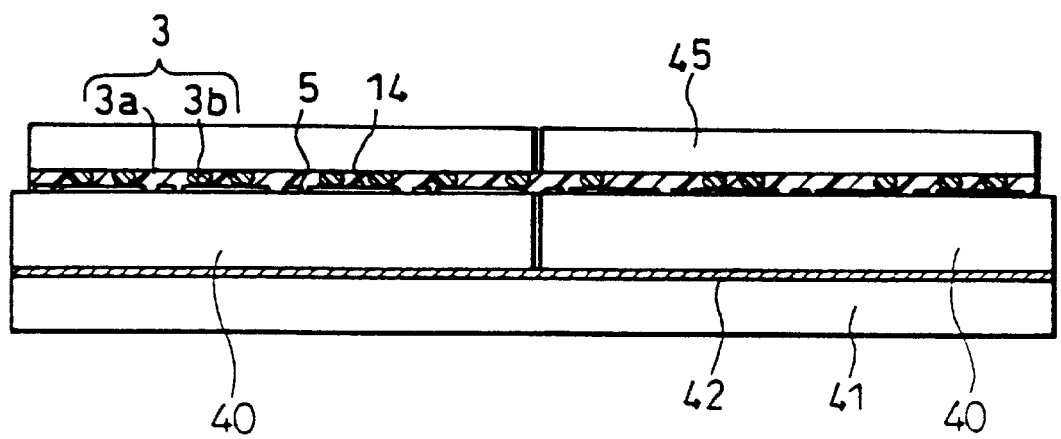
FIG. 8(a) is a cross section schematically showing an arrangement of an entire 2-D image detector in accordance with a third embodiment of the present invention and FIG. 8(b) is a plan view of the 2-D image detector.
Figure 8B:
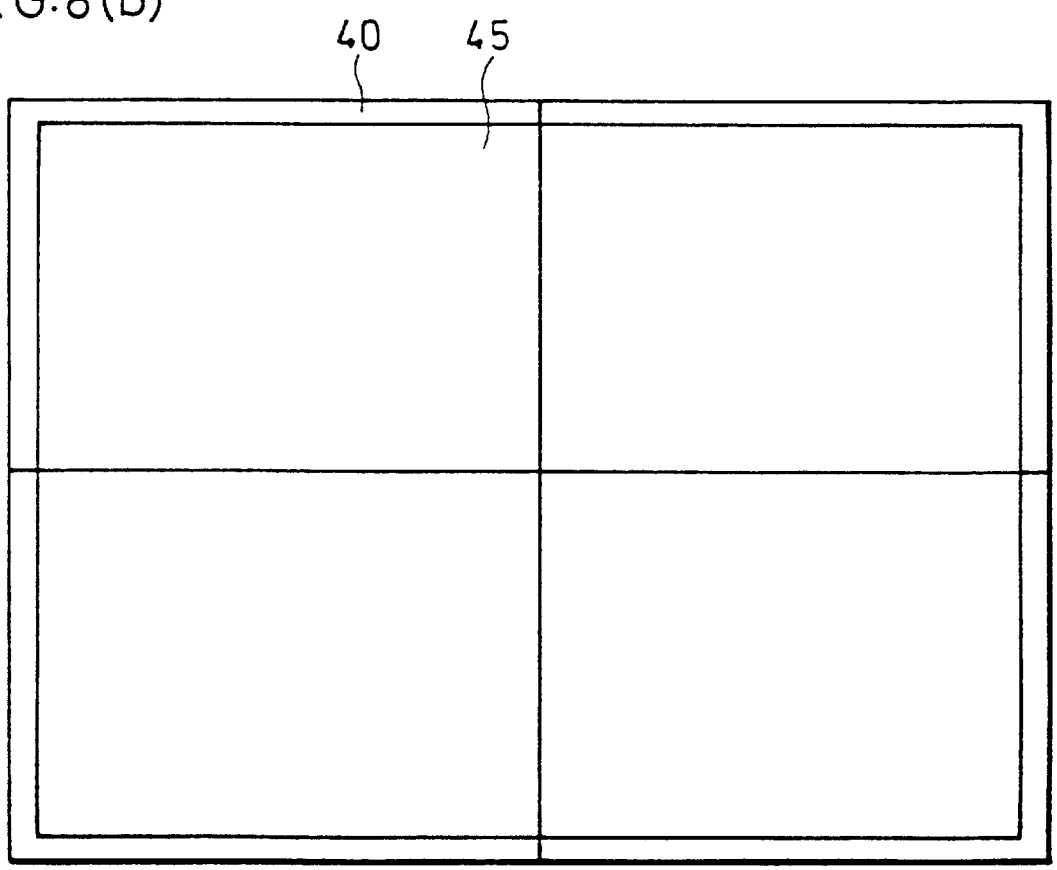

FIGS. 8(*a*) and 8(*b*) show a 2-D image detector in accordance with the present embodiment. FIG. 8(*a*) is a cross section schematically showing an arrangement of the entire 2-D image detector, and FIG. 8(*b*) is a plan view of the 2-D image detector seen from above (from a counter substrate 45 side).

Since the 2-D image detector of the present invention is similar to its counterpart in Embodiment 1 shown in FIGS. 1(*a*) and 1(*b*) and FIG. 2, like components are labeled with like reference numerals with respect to FIGS. 1(*a*) and 1(*b*) and FIG. 2, and the description of these components is not repeated for ease of explanation.

In the 2-D image detector of the present embodiment, both an active matrix substrate 40 and the counter substrate 45 are divided into a plurality of pieces. To be more specific, as shown in FIGS. 8(*a*) and 8(*b*), the active matrix substrate 40 is divided into four pieces and the counter substrate 45 is also divided into four pieces. Since the basic components are the same as those in Embodiment 1, the explanation of these components is omitted herein.

As shown in FIG. 8(*a*), since each of the substrates 40 and 45 is divided into four rectangles of substantially the same size which are symmetric to each other laterally and vertically, a supporting substrate 41 is additionally necessary to fix the substrates 40 and 45. FIG. 8(*a*) shows a state where four divided pieces of the active matrix substrate 40 are fixed onto the supporting plate 41 by means of a bonding agent (adhesive agent) 42.

A glass substrate, a metal substrate, a ceramic substrate, etc. can be used as the supporting substrate 41. However, the active matrix substrate 40 and supporting substrate 41 are preferably the glass substrates having thermal expansion coefficients as close as possible, because if the thermal expansion coefficients are different, the active matrix substrate 40 and supporting substrate 41 readily warp with respect to each other during the heating process.

The supporting substrate 41 can be placed at the counter substrate 45 side or both the active matrix substrate 40 side and the counter substrate 45 side. By fixedly aligning the divided pieces of each substrate (active matrix substrate 40 and counter substrate 45) on the independent supporting substrate 41, the mechanical strength of each junction of the divided pieces can be reinforced.

The arrangement of the 2-D image detector of the present embodiment is suitable for a case where the active matrix substrate 40 and counter substrate 45 can not be enlarged due to restrictions imposed by material and workmanship or cost.

Figure 9A:
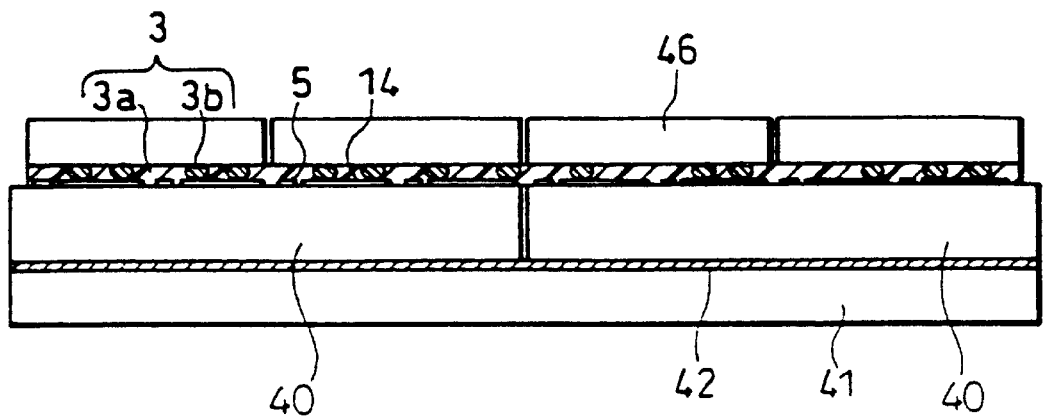
FIG. 9(a) is a cross section schematically showing another arrangement of the entire 2-D image detector in accordance with the third embodiment of the present invention and FIG. 9(b) is a plan view of the 2-D image detector.
Figure 9B:
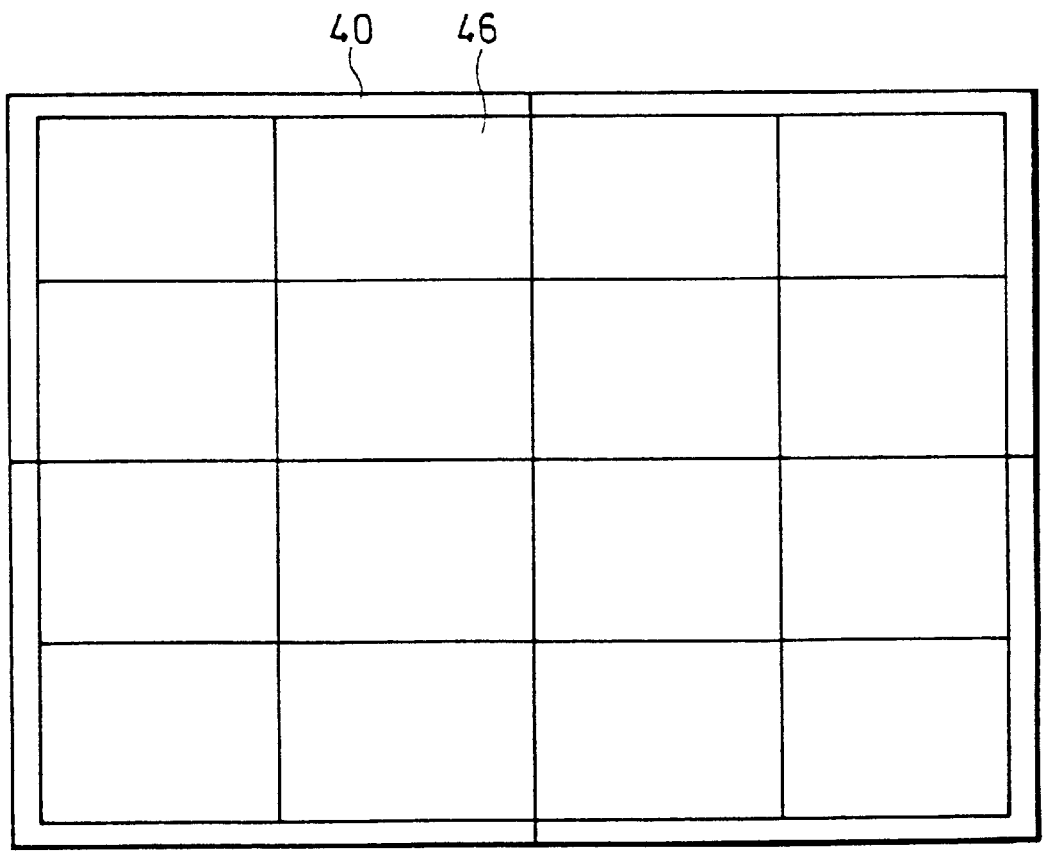

Besides the above arrangement, the counter substrate 45 alone may be divided into more pieces. FIGS. 9(*a*) and 9(*b*) show a 2-D image detector identical with the one shown in FIGS. 8(*a*) and 8(*b*) except that the counter substrate 45 is replaced with a counter substrate 46 composed of a larger number of divided pieces. FIG. 9(*a*) is a cross section schematically shows an arrangement of the entire 2-D image detector and FIG. 9(*b*) is a plan view of the 2-D image detector seen from above (from the counter substrate 46 side).

As shown in FIG. 9(*b*), the active matrix substrate 40 is divided into four pieces while the counter substrate 46 is divided into 16 pieces. The rest of the arrangement and manufacturing process are identical with those in Embodiments 1 through 3.

When arranged in this manner, an effect similar to the above-explained effect can be also obtained.

Embodiment 4

Referring to FIGS. 10(*a*) and 10(*b*) and FIG. 11, the following description will describe a 2-D image detector in accordance with Embodiment 4 of the present invention.

Embodiment 3 described the 2-D image detector comprising the active matrix substrate 40 and counter substrate 45 or 46, each of which being divided into a plurality of pieces, and the anisotropic conductive bonding agent 3 disposed into a place between the active matrix substrate 40 and counter substrate 45 or 46 in such a manner as to cover the 2-D image detector almost entirely.

The anisotropic conductive bonding agent 3 may be in the form of a film (generally known as ACF (Anisotropic Conductive Paste)) or in the form of paste (generally known as ACP (Anisotropic Conductive Paste)).

In case of a film of the anisotropic conductive bonding agent 3, since the size of the same is limited, there may be some cases where the 2-D image detector can not be covered by the ACF entirely. On the other hand, in case of paste of the anisotropic conductive bonding agent 3, an existing paste printing machine is not sufficiently large to handle large-area substrates, and a larger printing device has to be developed.

To solve the above problems, the 2-D image detector of the present embodiment is arranged in such a manner that not only the active matrix substrate 40 and counter substrate 45, but also the anisotropic conductive bonding agent 3 are divided into a plurality of pieces. Hereinafter, the anisotropic conductive bonding agent 3 composed of a plurality of divided pieces is referred to as the anisotropic conductive bonding agent 47.

FIG. 10(*a*) is a view schematically showing an arrangement of the entire 2-D image detector of the present embodiment, and FIG. 10(*b*) is a plan view of the 2-D image detector seen from above (from the counter substrate 45 side).

Since the 2-D image detector of the present embodiment is arranged substantially in the same manner as its counterpart in Embodiment 3, like components are labeled with like reference numerals with respect to Embodiment 3, and the description of these components is not repeated for ease of explanation.

The 2-D image detector of the present embodiment includes the active matrix substrate 40, counter substrate 45, and anisotropic conductive bonding agent 47, all of which are divided into a plurality of pieces. To be more specific, as shown in FIGS. 10(*a*) and 10(*b*), each of the active matrix substrate 40 and counter substrate 45 is divided into four rectangles which are symmetric with respect to each other laterally and vertically. Likewise, the anisotropic conductive bonding agent 47 is divided into a plurality of pieces.

Since the basic components of the active matrix substrate 40 and counter substrate 45 are identical with those of their respective counterparts in Embodiment 1, the explanation of these components is omitted herein for ease of explanation. Like in Embodiment 1, the anisotropic conductive bonding agent 47 is a mixture of an insulating bonding agent 47a and conductive particles 47b dispersed therein.

Figure 10A:
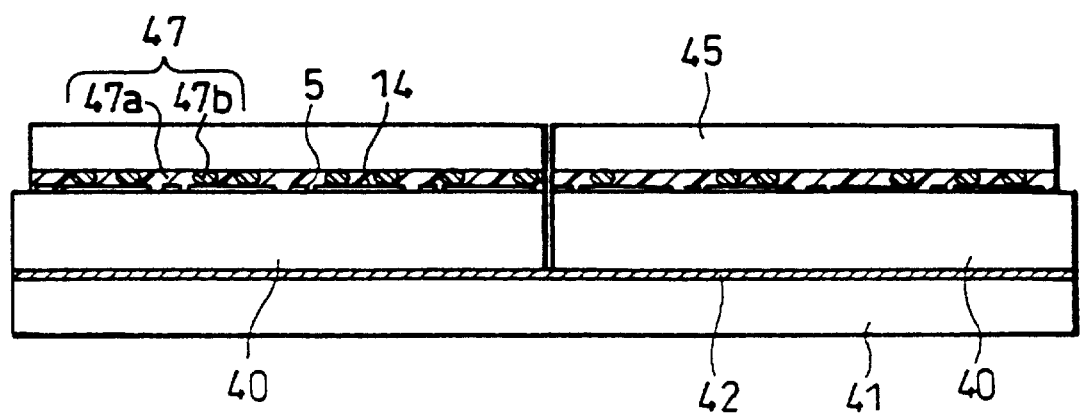
FIG. 10(a) is a cross section schematically showing an arrangement of another entire 2-D image detector in accordance with a fourth embodiment of the present invention and FIG. 10(b) is a plan view of the 2-D image detector.
Figure 10B:
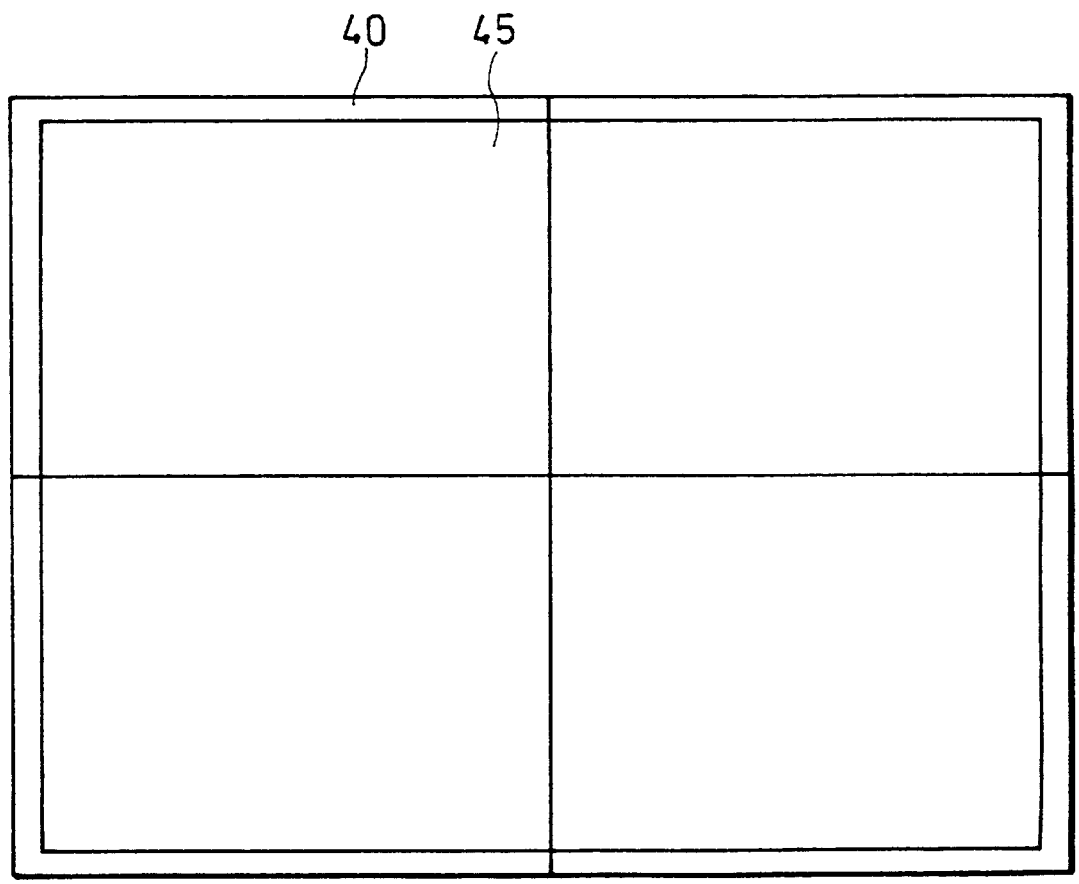

As shown in FIG. 10(b), each of the substrates 40 and 45 is divided into four pieces. For this reason, an independent supporting substrate 41 is necessary to fix the divided pieces of the substrates 40 and 45. FIG. 10(a) shows a state where the four divided pieces of the active matrix substrate 40 are fixed onto the supporting substrate 41 by means of a bonding agent (adhesive agent) 42. Since the supporting substrate 41 is basically arranged in the same manner as its counterpart in Embodiment 3, detailed explanation of which is omitted herein for ease of explanation.

FIGS. 11(a) through 11(d) are view showing the manufacturing process of the 2-D image detector of FIGS. 10(a) and 10(b). So, with reference to FIGS. 11(a) through 11(d), the following will explain the manufacturing process of the 2-D image detector of the present embodiment step by step.

Figure 11A:
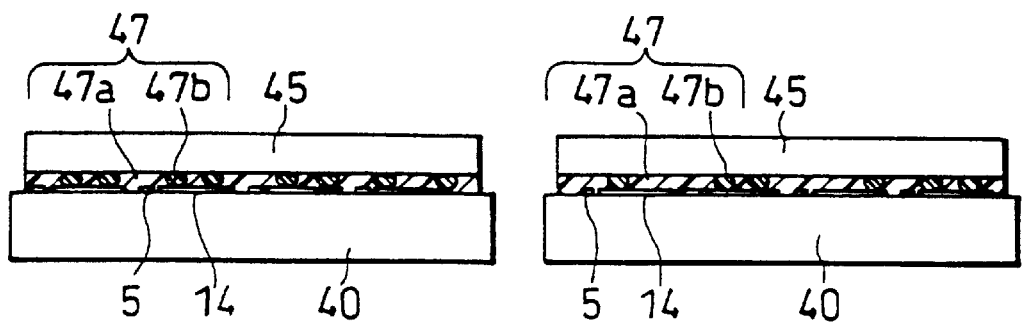
FIGS. 11(a) through 11(d) are views showing manufacturing steps of the 2-D image detector.

As shown in FIG. 11(a), the divided pieces of the active matrix substrate 40 and counter substrate 45, each of which is approximately ¼ of the resulting 2-D image detector in size, are laminated to each other by means of pieces of the anisotropic conductive bonding agent 47 having substantially the same size as the pieces of the substrates 40 and 45. Hereinafter, a resulting lamination of pieces of the active matrix substrate 40 and counter substrate 45 will be referred to as a panel.

Figure 11B:
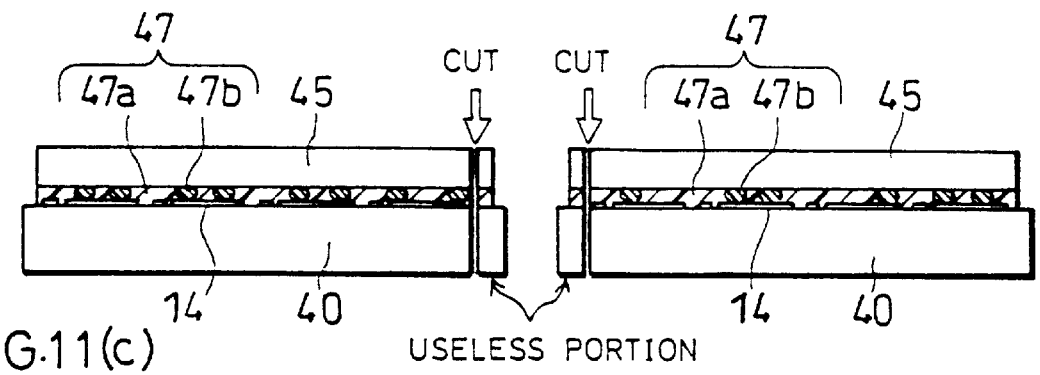

Then, as shown in FIG. 11(b), a useless portion of each panel is cut accurately at the connecting edge, at which the panels are connected to each other in the latter step.

Figure 11C:
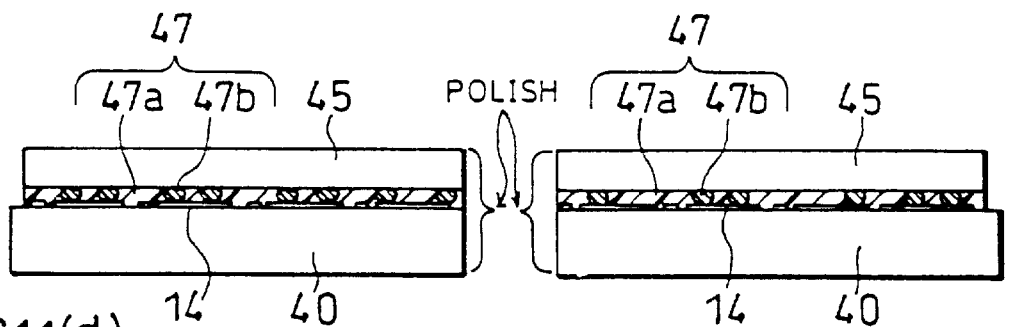

As shown in FIG. 11(c), the cross surface (connecting end surface of the panel) cut in the above cutting step of FIG. 11(b) is polished, so as to flatten the same further.

Figure 11D:
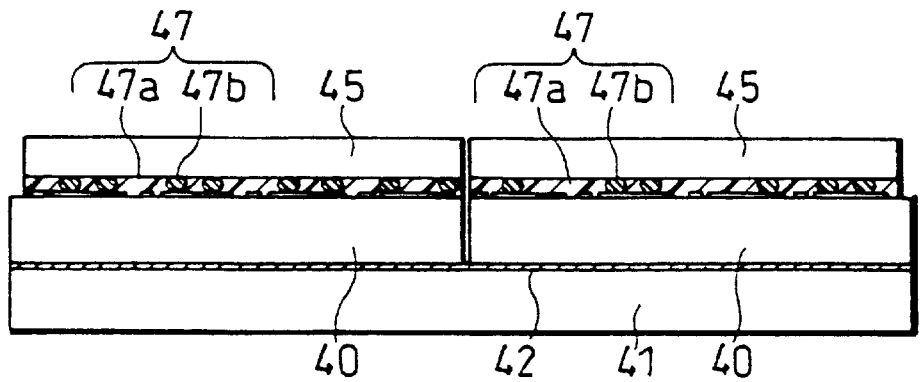

Finally, as shown in FIG. 11(d), the four panels are fixed onto the supporting substrate 41 by means of the bonding agent (adhesive agent). Here, each of the four panels is placed in such a manner that the active matrix substrate 40 side oppose the supporting substrate 41. Further, each of the panels are placed so that the cross sections (connecting end surfaces) of the panels approximate to each other as close as possible.

As has been explained, the 2-D image detector of the present embodiment is arranged in such a manner that not only the active matrix substrate 40 and counter substrate 45, but also the anisotropic conductive bonding agent 47 are divided into a plurality of pieces.

Hence, in addition to the active matrix substrate 40 and counter substrate 45, even when the anisotropic conductive bonding agent 47 can not be readily enlarged due to the restriction in material and workmanship or cost, a drop in yield can be suppressed, thereby making it possible to produce an inexpensive 2-D image detector.

It should be appreciated that the arrangement of dividing the anisotropic conductive bonding agent 47 into a plurality of pieces can be applied to the counterparts in Embodiments 1, 2 and 3, respectively.

When an anisotropic conductive bonding agent having a unique structure, such as an insulating bonding film pro-vided with a plurality of fine metal columns piercing through the film and disclosed in aforementioned Japanese Laid-Open Patent Application No. 306415/1996 (Japanese Official Gazette, Tokukaihei No. 8-306415, published on Nov. 22, 1996), is used as the anisotropic conductive bonding agent 47, there arises a problem that the cost increases with enlarging area of the anisotropic conductive bonding agent. Thus, it is very effective in such a case to use the divided anisotropic conductive bonding agent 47 like in the present embodiment.

Embodiments 1 through 4 described the 2-D image detectors which use mainly X-rays (radial rays). However, if the used semiconductor (photoconductor) shows the photoconductivity to visible light and/or infrared light in addition to X-rays, the resulting 2-D image detector can be also used for visible light and/or infrared light.

However, in such a case, the top electrode material, which is placed at the light incident end seen from the semiconductor (photoconductor), has to be a transparent electrode material, such as ITO, which can transmit visible light and infrared light. Also, the thickness of the semiconductor (photoconductor) has to be optimized in response to absorption efficiency of visible light and infrared light.

Also, Embodiments 1 through 4 described cases where CdTe or CdZnTe is used as the photoconductive semiconductor material. However, the semiconductor material of the present invention is not limited to the foregoing, and the same effect can be achieved even if other kinds of semiconductor materials, such as Si and Se, are used. Further, even if the counter substrate is a combination of a converting layer (for example, CsI) which converts X-rays into visible light and a photodiode for visible light, the same effect can be achieved.

Also, the switching elements formed on the active matrix substrate are not limited to the aforementioned thin film transistors (TFTs). Available examples include: MIM (Metal Insulator Metal), 2-terminal non-linear elements, such as a varister, and a non-linear elements composed of sets of a plurality of diodes, such as diode links and back-to-back diodes.

In Embodiments 1 through 4, when the divided pieces of the counter substrate or active matrix substrate are cut out in a predetermined shape from the mother substrates, an extremely accurate cutting technique is required. Thus, it is particularly effective to use a dicing cut method using a diamond blade or a laser cutting method using a thermal stress exerted by laser beam irradiation, because, by these methods, the substrates can be cut at the cutting accuracy of 50 μm or below.

In addition, Embodiments 1 through 4 described the 2-D image detectors comprising the active matrix substrate and counter substrate laminated to each other by means of the anisotropic conductive bonding agent, but the 2-D image detector of the present invention is not limited to the foregoing. For example, the two substrates can be bonded to each other electrically and mechanically by means of a photosensitive conductive material provided to each pixel, a soldering bump or an indium bump.

As has been discussed, a 2-D image detector of the present invention is characterized by comprising:

a pixel alignment layer composed of a matrix of electrode wires, a plurality of switching elements individually formed at intersections of the matrix, charge accumulating capacitors having pixel electrodes which are connected to the electrode wires through the switching elements;

an electrode section formed so as to oppose substantially an entire surface of the pixel alignment layer;

a photoconductive semiconductor layer formed between the pixel alignment layer and electrode section;

an active matrix substrate including the pixel alignment layer; and a counter substrate including the electrode section and semiconductor layer, wherein:

the active matrix substrate and counter substrate are placed in such a manner that the pixel alignment layer and semiconductor layer oppose each other;

the active matrix substrate and counter substrate are connected to each other electrically by a conductive connecting layer; and at least one of the active matrix substrate and counter substrate is divided into a plurality of pieces.

It is preferable that the conductive connecting layer is an anisotropic conductive connecting layer having conductivity only in a normal direction of opposing surfaces of the pixel alignment layer and semiconductor layer.

According to the above arrangement, by connecting the active matrix substrate including the pixel alignment layer and the counter substrate including the electrode sections and semiconductor layer by means of the conductive connecting layer, the active matrix substrate and counter substrate can be manufactured separately.

Conventionally, the semiconductor layer is formed on the substrate on which the pixel alignment layer has been already formed, and for this reason, semiconductor materials, which requires heat treatment that deteriorates the switching elements in the pixel alignment layer while the semiconductor layer is formed, can not be used. However, since the above arrangement makes it possible to manufacture the active matrix substrate and counter substrate separately, materials which could not been used in conventional methods due to the withstand temperature of the switching elements can be used for the semiconductor layer.

In general, the manufacturing process of the active matrix substrate involves a highly-sophisticated manufacturing technique, such as fine treatment by using the semiconductor layer, in the manufacturing process, and for this reason, yield in the manufacturing process drops sharply with enlarging area, thereby causing a problem that the cost is undesirably increased.

On the other hand, the counter substrate has a problem that, when the counter substrate is manufactured out of a semiconductor crystalline wafer, it is quite difficult to enlarge the wafer. Further, even in case that the semiconductor film is formed on an independent supporting substrate, a semiconductor film as thick as 100 $\mu$m or more has to be formed, and film stress which rises with enlarging area frequently causes deficiencies, such as film separation, in-plane irregularities in thickness and quality of the film, thereby making it difficult to manufacture inexpensive counter substrates. Thus, the counter substrate has also a problem that the yield drops sharply and the manufacturing costs are increased in turn.

To solve the above problem, the 2-D image detector of the present invention is arranged in such a manner that at least one of the active matrix substrate and counter substrate is divided into a plurality of pieces, and smaller divided pieces of the substrate can be manufactured inexpensively at high yield.

Consequently, even if the areas of the active matrix substrate and counter substrate are enlarged, an increase of the manufacturing costs can be suppressed without lowering the yield.

It should be noted that either of the active matrix substrate or counter substrate can be divided into a plurality of pieces, or the both substrates can be divided into a plurality of pieces. Here, the cost can be saved in accordance with the number of divided pieces.

The 2-D image detector is arranged in such a manner that the active matrix substrate is electrically connected to the counter substrate by means of the conductive connecting layer. However, in order to prevent a cross talk between the adjacent pixels on the substrate surface, the conductive connecting layer is preferably an anisotropic conductive connecting layer which is electrically isolated in the in-plane direction and shows conductivity only in the vertical direction (the normal direction of the opposing surfaces of the pixel alignment layer on the active matrix substrate and semiconductor layer on the counter substrate). A material which can bond the two substrates mechanically and electrically is particularly preferable, and an optimal example is an anisotropic conductive bonding agent made of a bonding agent and conductive particles dispersed therein.

Such an anisotropic conductive bonding agent generally demands a curing process, in which the anisotropic conductive bonding agent is cured while it is sandwiched by the substrates and pressed under a pressure ranging from 10 to 30 kgf/cm$^2$. This process is necessary to stabilize the conduction by deforming the conductive particles dispersed in the anisotropic conductive bonding agent to some extent, thereby enlarging a contact area with the electrodes.

When large-area substrates are laminated to each other by means of such an anisotropic conductive bonding agent, a pressing force rises sharply with enlarging area while the pressing force has to be applied uniformly. Accordingly, in order to handle a large-area substrate, a conventional pressing device has to be upsized. For example, if substrates of 430 mm×350 mm are laminated by means of the anisotropic conductive bonding agent which requires a pressing force of 20 kgf/cm$^2$, then a pressing force of approximately 30000 kgf/cm$^2$ has to be applied.

However, if at least one of the active matrix substrate and counter substrate is divided into a plurality of pieces, the pressing force can be reduced in accordance with the number of divided pieces. To be more specific, if the 12 divided pieces of the counter substrate are sequentially aligned, a pressing force as low as 2500 kgf/cm$^2$ is sufficient for each piece, thereby making it possible to reduce the pressing force to $\frac{1}{10}$ or less. Accordingly, the pressing device can be downsized. Further, since the area of each divided piece of the counter substrate is $\frac{1}{12}$ of the entire area of the counter substrate, a pressure can be more readily applied uniformly across the plane.

Further, the semiconductor layer of the 2-D image detector may have sensitivity to radial rays.

According to the above arrangement, since the semiconductor layer has sensitivity to radial rays, the resulting 2-D image detector can detect an image by using radial rays.

Further, it is preferable that the semiconductor layer is a compound semiconductor selected from CdTe and CdZnTe.

According to the above arrangement, the semiconductor layer can be made of CdTe or CdZnTe compound semiconductor.

Consequently, compared with a conventional a-Se semiconductor layer, the resulting semiconductor layer has better sensitivity to radial rays, and the 2-D image detector employing the same can be used for motion pictures.

Also, with the 2-D image detector of the present invention, the active matrix substrate is divided into a plurality of pieces; and each of the plurality of pieces is formed by cutting mother substrates having a single wire pattern in accordance with their respective positions in the active matrix substrate.

According to the above arrangement, the divided pieces of the active matrix substrate can be produced by cutting the mother substrates having a single wire pattern in accordance with the position in the active matrix substrate.

Consequently, since it is not necessary to produce the divided pieces of the substrates having specific wire patterns in accordance with the positions in the active matrix substrate, the manufacturing costs can be saved.

Also, with the 2-D image detector of the present invention, the counter substrate uses the photoconductive semiconductor as a supporting substrate.

According to the above arrangement, the counter substrate includes the photoconductive semiconductor layer as the supporting substrate.

Consequently, a crystalline semiconductor substrate obtained by the Bridgman, gradient freezing method, or travel heating method can be readily used as the semiconductor layer.

In addition, with the 2-D image detector of the present invention, the counter substrate may include a substrate which can transmit detected light or detected radial rays as a supporting substrate, and a photoconductive semiconductor film may be formed over the supporting substrate.

According to the above arrangement, the counter substrate uses the substrate which can transmit the detected light or radial rays as the supporting substrate, and the photoconductive semiconductor film is formed on the supporting substrate.

Consequently, the strength of the counter substrate can be increased.

Further, the plurality of divided pieces of the substrate are preferably aligned and fixed adjacently on a single plane.

According to the above arrangement, the divided pieces of the substrate are tiled adjacently as panes and fixed on a single plane of an independent large-sized supporting substrate.

Consequently, the mechanical strength of the joints of the divided pieces of the substrate can be reinforced.

Further, with the 2-D image detector of the present invention, the conductive connecting layer may be an anisotropic conductive bonding agent which are divided into a plurality of pieces in the matching numbers with the divided pieces of the substrate.

According to the above arrangement, the conductive connecting layer is an anisotropic conductive bonding agent which are divided into a plurality of pieces in the matching numbers with the divided pieces of the substrate.

Consequently, when it is difficult to enlarge the anisotropic conductive bonding agent due to the restriction of material and workmanship or cost. For example, when the anisotropic conductive bonding agent is an anisotropic conductive bonding agent having a unique structure, such as an insulating bonding film provided with a plurality of fine metal columns piercing through the film and disclosed in aforementioned Japanese Laid-Open Patent Application No. 306415/1996 (Japanese Official Gazette, Tokukaihei No. 8-306415, published on Nov. 22, 1996), there arises a cost problem in enlarging the same. However, even in such a case, a large-area 2-D image detector can be readily realized while suppressing an increase of the cost.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A 2-D image detector comprising:
   an active matrix substrate having a pixel alignment layer including switching elements and charge accumulating capacitors having pixel electrodes connected to said switching elements;
   a counter substrate having an electrode layer and a photoconductive semiconductor layer, placed in such a manner that said semiconductor layer opposes to the pixel alignment layer of said active matrix substrate; and
   a conductive connecting layer, provided between said active matrix substrate and counter substrate, for connecting said active matrix substrate to said counter substrate,
   at least one of said active matrix substrate and counter substrate being divided into a plurality of pieces.

2. The 2-D image detector of claim 1, wherein said semiconductor layer has sensitivity to radial rays.

3. The 2-D image detector of claim 2, wherein said semiconductor layer is a compound semiconductor selected from CdTe and CdZnTe.

4. The 2-D image detector of claim 1, wherein:
   said active matrix substrate is divided into a plurality of pieces; and
   each of said plurality of pieces is formed by cutting mother substrates having a single wire pattern in accordance with their respective positions in said active matrix substrate.

5. The 2-D image detector of claim 1, wherein said counter substrate uses said photoconductive semiconductor as a supporting substrate.

6. The 2-D image detector of claim 1, wherein said counter substrate includes a substrate which can transmit one of detected light and detected radial rays as a supporting substrate, and a photoconductive semiconductor film is formed over said supporting substrate.

7. The 2-D image detector of claim 1, wherein said plurality of pieces of the substrate are aligned and fixed adjacently on a single plane.

8. The 2-D image detector of claim 1, wherein said counter substrate includes a charge blocking layer on said semiconductor layer so as to inhibit charge injection from one of surfaces thereof.

9. The 2-D image detector of claim 1, wherein said counter substrate includes a charge blocking layer between said electrode layer and semiconductor layer so as to inhibit charge injection from one of surfaces thereof.

10. The 2-D image detector of claim 1, wherein both the active matrix substrate and counter substrate are divided into a plurality of pieces fixed onto a supporting substrate.

11. The 2-D image detector of claim 1, wherein said conductive connecting layer is made of a photosensitive conductive material provided to each pixel.

12. A 2-D image detector comprising:
   a pixel alignment layer composed of a matrix of electrode wires, a plurality of switching elements individually formed at intersections of said matrix, charge accumulating capacitors having pixel electrodes which are connected to said electrode wires through said switching elements;
   an electrode section formed so as to oppose substantially an entire surface of said pixel alignment layer;

a photoconductive semiconductor layer formed between said pixel alignment layer and electrode section;

an active matrix substrate including said pixel alignment layer; and a counter substrate including said electrode section and semiconductor layer, wherein:

said active matrix substrate and counter substrate are placed in such a manner that said pixel alignment layer and semiconductor layer oppose each other;

said active matrix substrate and counter substrate are connected to each other electrically by a conductive connecting layer; and at least one of said active matrix substrate and counter substrate is divided into a plurality of pieces.

13. A 2-D image detector comprising:

an active matrix substrate having a pixel alignment layer including switching elements and charge accumulating capacitors having pixel electrodes connected to said switching elements;

a counter substrate having an electrode layer and a photoconductive semiconductor layer, placed in such a manner that said semiconductor layer opposes to the pixel alignment layer of said active matrix substrate; and a conductive connecting layer, provided between said active matrix substrate and counter substrate, for connecting said active matrix substrate to said counter substrate, at least one of said active matrix substrate and counter substrate being divided into a plurality of pieces;

wherein said conductive connecting layer is an anisotropic conductive connecting layer having conductivity only in a normal direction of opposing surfaces of said pixel alignment layer and semiconductor layer; and wherein said anisotropic conductive connecting layer is divided into a plurality of pieces in matching numbers with said plurality of pieces of the substrate.

14. A 2-D image detector comprising:

an active matrix substrate having a pixel alignment layer including switching elements and charge accumulating capacitors having pixel electrodes connected to said switching elements;

a counter substrate having an electrode layer and a photoconductive semiconductor layer, placed in such a manner that said semiconductor layer opposes to the pixel alignment layer of said active matrix substrate; and a conductive connecting layer, provided between said active matrix substrate and counter substrate, for connecting said active matrix substrate to said counter substrate, at least one of said active matrix substrate and counter substrate being divided into a plurality of pieces; and wherein said conductive connecting layer is an anisotropic conductive bonding agent made of a mixture of an insulating bonding agent and conductive particles dispersed therein.

15. The 2-D image detector of claim 14, wherein said bonding agent is a thermo-setting type.

16. The 2-D image detector of claim 14, wherein said bonding agent is a thermo-plastic type.

17. The 2-D image detector of claim 14, wherein said bonding agent is a photo-setting type.

18. The 2-D image detector of claim 14, wherein said conductive connecting layer is paste.

19. The 2-D image detector of claim 14, wherein said conductive connecting layer is a film.

20. A 2-D image detector comprising:

an active matrix substrate having a pixel alignment layer including switching elements and charge accumulating capacitors having pixel electrodes connected to said switching elements;

a counter substrate having an electrode layer and a photoconductive semiconductor layer, placed in such a manner that said semiconductor layer opposes to the pixel alignment layer of said active matrix substrate; and a conductive connecting layer, provided between said active matrix substrate and counter substrate, for connecting said active matrix substrate to said counter substrate, at least one of said active matrix substrate and counter substrate being divided into a plurality of pieces; and wherein said conductive connecting layer is an anisotropic conductive connecting layer having conductivity only in a normal direction of opposing surfaces of said pixel alignment layer and semiconductor layer.

* * * * *